(12) United States Patent
Kim et al.

(10) Patent No.: US 9,048,430 B2
(45) Date of Patent: Jun. 2, 2015

(54) NON-HALOGENATED ETCHANT AND METHOD OF MANUFACTURING A DISPLAY SUBSTRATE USING THE NON-HALOGENATED ETCHANT

(75) Inventors: Seon-Il Kim, Seoul (KR); Shin-Il Choi, Hwaseong-si (KR); Ji-Young Park, Hwaseong-si (KR); Sang-Gab Kim, Seoul (KR); O-Byoung Kwon, Wanju-gun (KR); Dong-Ki Kim, Cheongju-si (KR); Sang-Tae Kim, Iksan-si (KR); Young-Chul Park, Iksan-si (KR); In-Ho Yu, Iksan-si (KR); Young-Jin Yoon, Jeonju-si (KR); Suck-Jun Lee, Jeonju-si (KR); Joon-Woo Lee, Jeonju-si (KR); Min-Ki Lim, Iksan-si (KR); Sang-Hoon Jang, Jeonju-si (KR); Young-Jun Jin, Iksan-si (KR)

(73) Assignees: Samsung Display Co., Ltd., Yongin (KR); Dongwoo Fine-Chem Co., Ltd., Seoul (KR)

( * ) Notice: Subject to any disclaimer, the term of this patent is extended or adjusted under 35 U.S.C. 154(b) by 505 days.

(21) Appl. No.: 13/330,657

(22) Filed: Dec. 19, 2011

(65) Prior Publication Data
US 2012/0208310 A1    Aug. 16, 2012

(30) Foreign Application Priority Data

Feb. 15, 2011 (KR) .................. 10-2011-0013098

(51) Int. Cl.
 *H01L 21/00* (2006.01)
 *H01L 51/00* (2006.01)

(52) U.S. Cl.
 CPC ....... *H01L 51/0023* (2013.01); *H01L 2251/308* (2013.01)

(58) Field of Classification Search
 USPC .......... 438/30–46, 149–161, 609; 257/13–59, 257/749, E21.143, E21.413, E21.292, 257/E27.111, E29.292, E33.053
 See application file for complete search history.

(56) References Cited

U.S. PATENT DOCUMENTS

| 5,456,765 | A | 10/1995 | Sato et al. |
| 5,726,077 | A | 3/1998 | Kawahata et al. |
| 2009/0318063 | A1* | 12/2009 | Misra ............................. 451/28 |
| 2010/0060839 | A1* | 3/2010 | Suzuki et al. ................ 349/147 |
| 2010/0252530 | A1 | 10/2010 | Durante et al. |
| 2011/0183476 | A1* | 7/2011 | Lee et al. ..................... 438/151 |
| 2011/0187949 | A1* | 8/2011 | Chang ............................. 349/33 |

FOREIGN PATENT DOCUMENTS

| CN | 1426492 | 6/2003 |
| CN | 10-1684557 | 3/2010 |
| KR | 10-1996-0002903 | 1/1996 |
| KR | 10-2000-0017470 | 3/2000 |
| KR | 10-2005-0077451 | 8/2005 |
| KR | 10-2006-0050581 | 5/2006 |
| KR | 10-2009-0082772 | 7/2009 |
| KR | 10-2010-0053175 | 5/2010 |

* cited by examiner

*Primary Examiner* — Charles Garber
*Assistant Examiner* — Abdulfattah Mustapha
(74) *Attorney, Agent, or Firm* — H.C. Park & Associates, PLC

(57) ABSTRACT

Exemplary embodiments of the present invention disclose a non-halogenated etchant for etching an indium oxide layer and a method of manufacturing a display substrate using the non-halogenated etchant, the non-halogenated etchant including nitric acid, sulfuric acid, a corrosion inhibitor including ammonium, a cyclic amine-based compound, and water.

23 Claims, 15 Drawing Sheets

| ETCHING TIME | EXAMPLE1 | |
|---|---|---|
| | ETCHING RESULT OF IZO LAYER | SURFACE CONDITION OF COPPER LAYER |
| 20sec |  |  |
| 30sec |  |  |
| 40sec |  |  |
| 60sec |  |  |
| 80sec |  |  |
| 100sec |  |  |
| 150sec |  |  |
| 200sec |  |  |

| ETCHING TIME | COMPARATIVE EXAMPLE1 ||
| | ETCHING RESULT OF IZO LAYER | SURFACE CONDITION OF COPPER LAYER |
|---|---|---|
| 20sec |  |  |
| 30sec |  |  |
| 40sec |  |  |
| 60sec |  |  |
| 80sec |  |  |
| 100sec |  |  |
| 150sec |  |  |
| 200sec |  |  |

0.77 μm 0.76 μm 0.76 μm 0.76 μm 0.77 μm 0.128 μm 0.238 μm 0.394 μm 0.519 μm

NON-HALOGENATED ETCHANT AND METHOD OF MANUFACTURING A DISPLAY SUBSTRATE USING THE NON-HALOGENATED ETCHANT

CROSS REFERENCE TO RELATED APPLICATION

This application claims priority from and the benefit of Korean Patent Application No. 2011-0013098, filed on Feb. 15, 2011 which is hereby incorporated by reference for all purposes as if fully set forth herein.

BACKGROUND OF THE INVENTION

1. Field of the Invention

Exemplary embodiments of the present invention relate to a non-halogenated etchant and a method of manufacturing a display substrate using the non-halogenated etchant. More particularly, exemplary embodiments of the present invention relate to a non-halogenated etchant for etching an indium oxide layer used for manufacturing a display substrate and a is method of manufacturing a display substrate using the non-halogenated etchant.

2. Discussion of the Background

Generally, a display panel includes a display substrate on which a thin-film transistor (TFT) as a switching element for driving a pixel is formed. The display substrate includes a plurality of metal patterns mainly formed via a photolithography process. In the photolithography process, a photoresist layer is formed on a substrate on which a layer for being etched is formed. After the photoresist layer is exposed by light and is developed to form a photoresist pattern, the layer is etched by an etchant using the photoresist pattern as an etching stop layer in order to pattern the layer.

In etching the layer, the layer in a region exposed through the photoresist pattern is removed by the etchant so that a lower layer disposed under the layer is exposed. Then, the lower layer exposed through the patterned layer contacts with the etchant so that the lower layer may be damaged by the etchant.

Examples of an etchant used for etching a layer including an indium oxide layer include an aqua regia based etchant (Korean Publication No. 1996-2903), an iron chloride based etchant (U.S. Pat. No. 5,456,765), and an oxalic acid based etchant (Korean publication No. 2000-17470). However, the above etchants may have chemically strong activity so that the lower layer under the etched layer may be easily damaged by the etchants. In order to solve the above problem, an etchant composition (Korean Publication No. 2005-77451) including sulfuric acid as a main oxidizing agent and nitric acid or perchloric acid as a sub oxidizing agent has been developed, and the lower layer may not be damaged by the etchant composition when the lower layer includes aluminum-niobium (Al—Nb), molybdenum (Mo), or chrome (Cr).

However, when the lower layer includes a copper (Cu) layer, the indium oxide is layer formed on the lower layer is etched using the etchant composition so that a surface of the copper layer may be damaged by the etchant composition. Thus, the etchant composition may not be used when the lower layer includes the copper layer. Accordingly, an etchant composition for etching the indium oxide layer when the lower layer includes copper may need to have different components from an etchant composition for etching the indium oxide layer when the lower includes aluminum. Therefore, a manufacturer may need to prepare different etchant compositions depending on the composition of the lower layer, thereby increasing a manufacturing cost.

SUMMARY OF THE INVENTION

Exemplary embodiments of the present invention provide a non-halogenated etchant for etching an indium oxide layer, the non-halogenated etchant capable of minimizing damage to a lower layer when etching the indium oxide layer as an upper layer even if the lower layer includes a copper layer or an aluminum layer.

Exemplary embodiments of the present invention also provide a method of manufacturing a display substrate using the non-halogenated etchant.

Additional features of the invention will be set forth in the description which follows, and in part will be apparent from the description, or may be learned by practice of the invention.

According to an exemplary embodiment of the present invention, a non-halogenated etchant includes nitric acid, sulfuric acid, a corrosion inhibitor including ammonium, a cyclic amine-based compound, and water.

An exemplary embodiment of the present invention also discloses a method of is manufacturing a display substrate using a non-halogenated etchant. In the method, a switching element including a gate electrode, a source electrode and a drain electrode is formed on a substrate. An indium oxide layer is formed on the substrate. The indium oxide layer is patterned using the non-halogenated etchant including nitric acid, sulfuric acid, a corrosion inhibitor including ammonium, a cyclic amine-based compound and water to form a first pixel electrode electrically connected to the drain electrode.

An exemplary embodiment of the present invention also discloses a method of manufacturing a display substrate using a non-halogenated etchant. In the method, a switching element including a gate electrode, a source electrode and a drain electrode is formed on a substrate. A first pixel electrode directly contacting the drain electrode and including an indium oxide layer is formed. The first pixel electrode is removed using a non-halogenated etchant including nitric acid, sulfuric acid, a corrosion inhibitor including ammonium, a cyclic amine-based compound and water. Then, a second pixel electrode directly contacting the drain electrode is formed on the substrate after removing the first pixel electrode.

An exemplary embodiment of the present invention also discloses a method of manufacturing a display substrate using a non-halogenated etchant. In the method, a conductor is formed on a substrate. An indium oxide layer is formed on the substrate. The indium oxide layer is patterned using the non-halogenated etchant including nitric acid, sulfuric acid, a corrosion inhibitor including ammonium, a cyclic amine-based compound and water. The indium oxide layer is electrically connected to the conductor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
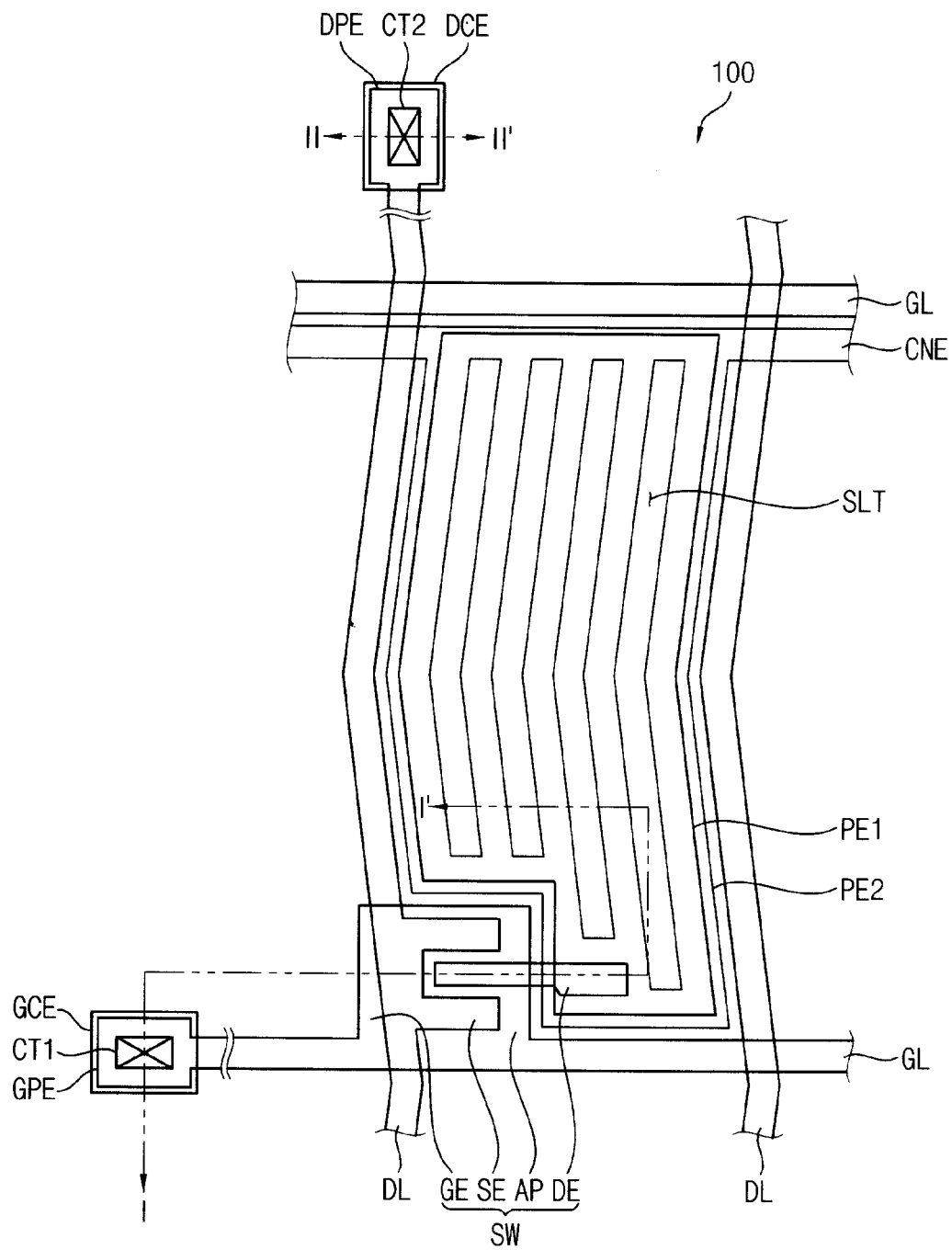
FIG. 1 is a plan view illustrating a display substrate manufactured according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Hereinafter, after a non-halogenated etchant of the present invention is described, a method of manufacturing a display substrate using the non-halogenated etchant, and experimental results will be illustrated.

The non-halogenated etchant for etching an indium oxide layer according the present invention includes nitric acid, sulfuric acid, a corrosion inhibitor including ammonium ($NH_4^+$), a cyclic amine based compound, and water. The non-halogenated etchant does not include a halogenated compound.

Nitric acid and sulfuric acid used for the non-halogenated etchant may be main components for etching the indium oxide layer. Nitric acid is a component for etching the indium oxide layer. In addition, nitric acid may prevent a photoresist pattern used as an etching stop layer of the indium oxide layer from being damaged, and minimize residues of the indium is oxide layer. Each of the nitric acid and the sulfuric acid may be prepared via conventionally known methods. Amounts of nitric acid and sulfuric acid in the non-halogenated etchant may be used in a range so that the stability of the non-halogenated etchant is not harmed.

When an amount of sulfuric acid is less than about 1% by weight based on a total weight of the non-halogenated etchant, an etching rate for the indium oxide layer may be slowed. In addition, when the amount of sulfuric acid is greater than about 10% by weight based on the total weight of the non-halogenated etchant, the non-halogenated etchant may chemically damage the photoresist pattern or a lower layer of the indium oxide layer. Therefore, the amount of sulfuric acid in the non-halogenated etchant may be between about 1% by weight and about 10% by weight based on the total weight of the non-halogenated etchant. Alternatively, the amount of sulfuric acid in the non-halogenated etchant may be between about 3% by weight and about 8% by weight.

When an amount of nitric acid is less than about 1% by weight based on the total weight of the non-halogenated etchant, the etching rate for the indium oxide layer may be slowed and the photoresist pattern may be damaged. When the amount of nitric acid is greater than about 10% by weight based on the total weight of the non-halogenated etchant, the non-halogenated etchant may damage the lower layer of the indium oxide layer. Therefore, the amount of nitric acid in the non-halogenated etchant may be between about 1% by weight and about 10% by weight based on the total weight of the non-halogenated etchant. Alternatively, the amount of nitric acid in the non-halogenated etchant may be between about 5% by weight and about 10% by weight.

The corrosion inhibitor may inhibit the non-halogenated etchant from damaging the lower layer of the indium oxide layer. For example, the corrosion inhibitor may inhibit nitric is acid and sulfuric acid from corroding the lower layer including aluminum (Al).

The corrosion inhibitor includes ammonium ($NH_4^+$). Examples of a material that may be used for the corrosion inhibitor may include ammonium acetate ($CH_3COONH_4$), ammonium sulfamate ($NH_4SO_3NH_2$), ammonium benzenediol ($NH_4C_6H_4(OH)_2$), ammonium carbamate ($NH_2COONH_4$), ammonium dihydrogen phosphate ($NH_4H_2PO_4$), ammonium formate ($NH_4COOH$), ammonium bicarbonate ($NH_4HCO_3$), ammonium citrate ($H_4NO_2CCH_2C(OH)(CO_2NH_4)CH_2CO_2NH_4$)), ammonium nitrate ($NH_4NO_3$), ammonium persulfate (($NH^4)_2S_2O_8$), ammonium sulphamate ($H_2NSO_3NH_4$), and ammonium sulfate (($NH_4)_2SO_4$), etc. These may be used alone or in a combination thereof.

When an amount of the corrosion inhibitor is less than about 0.1% by weight based on the total weight of the non-halogenated etchant, the non-halogenated etchant may not inhibit a metal of the lower layer from being corroded by nitric acid and sulfuric acid. When the amount of the corrosion inhibitor is greater than about 5% by weight, the etching rate of the non-halogenated etchant for the indium oxide layer may be slowed. Thus, the amount of the corrosion inhibitor may be between about 0.1% by weight and about 5% by weight. Alternatively, the amount of the corrosion inhibitor may be between about 0.5% by weight and about 3% by weight.

The cyclic amine based compound may inhibit nitric acid and sulfuric acid from damaging the lower layer of the indium oxide layer. For example, the cyclic amine based compound may inhibit nitric acid and sulfuric acid from corroding the lower layer including copper (Cu).

The cyclic amine based compound may include a water-soluble heterocyclic amine compound. Examples of a material that may be used for the cyclic amine based is compound may include aminotetrazole, imidazole, indole, purine, pyrazole, pyridine, pyrimidine, pyrrole, pyrrolidine and pyrroline, etc. These may be used alone or in a combination thereof.

When an amount of the cyclic amine based compound is less than about 0.1% by weight based on the total weight of the non-halogenated etchant, the non-halogenated etchant may not substantially inhibit nitric acid and sulfuric acid from corroding a metal of the lower layer. When the amount of the cyclic amine based compound is greater than about 5% by weight, the etching rate of the non-halogenated etchant for the indium oxide layer may be slowed. Thus, the amount of the cyclic amine based compound may be between about 0.1% by weight and about 5% by weight. Alternatively, the amount of the cyclic amine based compound may be between about 0.3% by weight and about 2% by weight.

The non-halogenated etchant does not include a halogenated compound, which is a compound having fluorine (F), chlorine (Cl), bromine (Br) or iodine (I). Although the halogenated compound supports etching the indium oxide layer of nitric acid and sulfuric acid in a conventional etchant, a copper layer may be easily damaged by the halogenated compound when the lower layer of the indium oxide layer includes the copper layer.

Examples of the halogenated compound not included in the non-halogenated etchant may include sodium chloride (NaCl), potassium chloride (KCl), hydrochloric acid (HCl), silver chloride (AgCl), iron chloride ($FeCl_2$), copper chloride ($CuCl_2$), fluoric acid (HF), ammonium bifluoride ($NH_4FHF$), potassium bifluoride (KFHF), sodium bifluoride (NaFHF), potassium fluoride (KF), sodium fluoride (NaF), bromic acid ($HBrO_3$), silver bromide (AgBr), potassium bromide (KBr), potassium iodide (KI), sodium iodide (NaI), and potassium iodic acid ($KIO_3$). The non-halogenated etchant does not contain any compound of the above halogenated compounds.

The non-halogenated etchant includes water, other than nitric acid, sulfuric acid, the corrosion inhibitor, and the cyclic amine based compound. Water used in the non-halogenated etchant is not limited to a specific type. The water used in the non-halogenated etchant may include desalted water. Alternatively, water used in the non-halogenated etchant may include the desalted water having a specific resistance of about 18MΩ/cm. An amount of water used in the non-halogenated etchant is determined by the amounts of nitric acid, sulfuric acid, the corrosion inhibitor, and the cyclic amine based compound. For example, water may be the remainder excluding the amounts of nitric acid, sulfuric acid, the corrosion inhibitor, and the cyclic amine based compound from the total weight of the non-halogenated etchant.

Alternatively, the non-halogenated etchant may further include an additive capable of supporting and controlling the functions of the nitric acid, sulfuric acid, the corrosion inhibitor, and the cyclic amine based compound, excluding nitric acid, sulfuric acid, the corrosion inhibitor and the cyclic amine based compound. For example the additive may include a surfactant, a metal ion blocking agent, etc. When an amount of the additive is less than about 0.0001% by weight based on the total weight of the non-halogenated etchant, the additive may not function. When the amount of the additive is greater than about 0.01% by weight, the additive may negatively effect the chemical stability of the non-halogenated etchant. Therefore, the amount of the additive may be between about 0.0001% by weight and about 0.01% by weight. When the non-halogenated etchant further includes the additive, the amount of water may be substantially the same as a difference between a total amount of the non-halogenated etchant and sum of the amounts of nitric acid, sulfuric acid, the corrosion inhibitor, the cyclic amine based compound, and the additive.

A layer to be etched by the non-halogenated etchant includes the indium oxide layer. The indium oxide layer may include indium zinc oxide (IZO), indium tin oxide (ITO), etc. The indium oxide layer may be amorphous, and not crystallized.

When the lower layer includes a copper layer, the non-halogenated etchant of the present invention may prevent the copper layer from being damaged during etching the indium oxide layer. Furthermore, even when the lower layer includes an aluminum layer, the non-halogenated etchant may also prevent the aluminum layer from being damaged. Thus, the non-halogenated etchant may minimize the damage of the lower layer including the copper layer and/or the aluminum layer. Further, the non-halogenated etchant of the indium oxide layer may prevent photosensitive materials of the photoresist pattern from being damaged, and residues of the indium oxide layer may be minimized. Furthermore, the non-halogenated etchant may include nitric acid, sulfuric acid, the corrosion inhibitor, and the cyclic amine based compound as main components so that a crystallization of oxalic acid of an oxalic based etchant in a temperature of less than about 0° C. or a damage of the lower layer by an aqua regia based etchant may be prevented by using the non-halogenated etchant to etch the indium oxide layer.

The present invention is described more fully hereinafter with reference to the accompanying drawings, in which exemplary embodiments of the present invention are shown.

Figure 2:
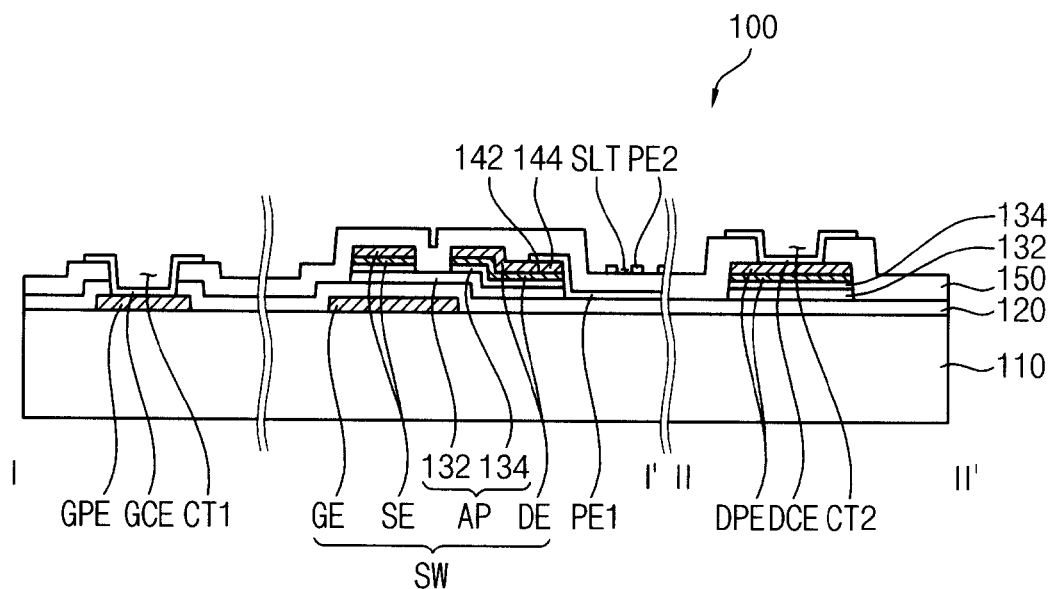
FIG. 2 is a cross-sectional view taken along line I-I' and line II-II' in FIG. 1.

FIG. 1 is a plan view illustrating a display substrate manufactured according to an exemplary embodiment of the present invention, and FIG. 2 is a cross-sectional view taken along line I-I' and line II-II' in FIG. 1.

Referring to FIG. 1 and FIG. 2, a display substrate 100 includes a gate line GL, a data line DL, a switching element SW, a first pixel electrode PE1 and a second pixel electrode PE2. The display substrate 100 further includes a gate pad electrode GPE and a data pad electrode DPE.

The gate line GL extends along a first direction D1 of the display substrate 100.

The gate line GL has a rectangular shape along the first direction D1. The data line DL extends along a second direction D2 different from the first direction D1. For example, the second direction D2 may be substantially perpendicular to the first direction D1. The data line DL has "<" shape diverging from a region between two gate lines GL adjacent to each other in different directions from each other toward the gate lines GL. The data line DL has a zigzag pattern repeating the "<" shape along the second direction D2. Alternatively, the data line DL may have a rectangular shape.

The switching element SW is electrically connected to the gate line GL, the data line DL and the first pixel electrode PE1. The switching element SW includes a gate electrode GE, a source electrode SE, an active pattern AP and a drain electrode DE. The gate electrode GE is connected to the gate line GL, and the source electrode SE is connected to the data line DL. The drain electrode DE is spaced apart from the source electrode SE. The active pattern AP is disposed under the source electrode SE and the drain electrode DE and is partially exposed through a space between the source and drain electrodes SE and DE. The active pattern AP includes semiconductor layer 132 and an ohmic contact layer 134. The drain electrode DE directly makes contact with the first pixel electrode PE1 so that the switching element SW is electrically connected to the first pixel electrode PE1.

The gate line GL, the gate electrode GE and the gate pad electrode GPE are formed from a same gate metal layer. The gate metal layer may include a single metal, an alloy metal or a multilayered structure having stacked metal layers different from each other.

The display substrate further includes a first insulating layer 120. The first insulating layer 120 is formed on a base substrate 110 on which the gate line GL, the gate is electrode GE and the gate pad electrode GPE are formed. The first insulating layer 120 is disposed between the gate line GL and the data line DL to insulate the gate line GL from the data line DL.

The data line DL, the source electrode SE, the drain electrode DE and the data pad electrode DPE are formed from a same source layer. The source layer may include a copper layer. For example, the source layer includes a first metal layer 142 formed on the ohmic contact layer 134 and a second metal layer 144 formed on the first metal layer 142. The second metal layer 144 may include the copper layer including copper (Cu), and the first metal layer 142 may include a titanium layer including titanium (Ti). The first metal layer 142 may improve an adhesive strength between the second metal layer 144 and the ohmic contact layer 134.

The active pattern AP is formed under the source electrode SE and the drain electrode DE. In addition, a dummy pattern having substantially the same layered structure as the active pattern AP is formed under the data line DL and the data pad electrode DPE. The dummy pattern includes the semiconductor layer 132 and the ohmic contact layer 134. The dummy pattern may be formed under the data line DL and the data pad electrode DPE in a process of forming the active pattern AP. Etched surfaces of the source electrode SE and the drain electrode DE may substantially coincide with side surfaces of the active pattern AP. In addition, an etched surface of the data pad electrode DPE may be substantially coincided with a side surface of the dummy pattern.

In a plan view, the first pixel electrode PE1 is surrounded by the gate line GL and the data line DL. A boundary of the first pixel electrode PE1 may be partially overlapped with the gate line GL and the data line DL. A portion of the drain electrode DE, which is opposite to another portion facing the source electrode SE, directly makes contact with the first pixel is electrode PE1. In a cross-sectional view, the first pixel electrode PE1 extends along a side surface of the drain electrode DE from an upper surface of the drain electrode DE to the first insulating layer 120. Thus, the first pixel electrode PE1 partially makes contact with the drain electrode DE and the first insulating layer 120.

The first pixel electrode PE1 includes an indium oxide layer. The indium oxide layer may include indium zinc oxide (IZO) or indium tin oxide (ITO), etc. The above-described non-halogenated etchant according to the present invention may be used for forming the first pixel electrode PE1. The first pixel electrode PE1 may be provided with a pixel voltage for driving the switching element SW through the switching element SW.

The display substrate 100 further includes a second insulating layer 150. The second insulating layer 150 is formed on the base substrate 110 on which the data line DL, the source electrode SE, the drain electrode DE, the data pad electrode DPE and the first pixel electrode PE1 are formed. The second insulating layer 150 includes a hole defining a first pad hole CT1 partially exposing the gate pad electrode GPE with the first insulating layer 120. The hole of the second insulating layer 150 may be substantially coincided with a hole of the first insulating layer 120 partially exposing the gate pad electrode GPE. Thus, the holes of the first and second insulating layers 120 and 150 may define the first pad hole CT1. In addition, the second insulating layer 150 further includes a hole partially exposing the data pad electrode DPE. The hole of the second insulating layer 150 exposing the data pad electrode DPE is defined as a second pad hole CT2.

The second pixel electrode PE2 is formed on the second insulating layer 150. The second pixel electrode PE2 overlaps with the first pixel electrode PE1 and is insulated from the first pixel electrode PE1 by the second insulating layer 150. The second pixel electrode PE2 is includes a slit pattern SLT defined by a plurality of bar electrodes which is spaced apart from each other. Since the bar electrodes have substantially the same "<" shape as the data line DL, the slit pattern SLT has also "<" shape. The bar electrodes are connected to each other, and the second pixel electrodes PE2 adjacent to each other are connected to a connecting electrode CNE. The slit pattern SLT is substantially an opening pattern. The second insulating layer 150 is partially exposed by the slit pattern SLT. A horizontal electric field is formed by the slit pattern SLT of the second pixel electrode PE2 between the first and second pixel electrodes PE1 and PE2. A liquid crystal (not shown) disposed on the second pixel electrode PE2 may be adjusted by the horizontal electric field.

The second pixel electrode PE2 includes an indium oxide layer. For example, the indium oxide layer may include indium tin oxide (ITO) or indium zinc oxide (IZO), etc. The above-mentioned non-halogenated etchant may be used for forming the second pixel electrode PE2. The second pixel electrode PE2 may be provided with a common voltage different from the pixel voltage applied to the first pixel electrode PE1.

Hereinafter, a region of the base substrate 110 in which the first and second pixel electrodes PE1 and PE2 are formed is defined as "pixel region" of the base substrate 110. For example, the gate line GL and the data line DL are disposed on a boundary of the pixel region. Alternatively, the gate line GL and the data line DL may be partially disposed in the pixel region.

The gate pad electrode GPE is defined as an end portion of the gate line GL. A gate contact electrode GCE is formed on the gate pad electrode GPE. The gate contact electrode GCE directly makes contact with the gate pad electrode GPE through the first pad hole CT1. The data pad electrode DPE is defined as an end portion of the data line DL. A data contact electrode DCE is formed on the data pad electrode DPE. The data contact electrode DCE is directly makes contact with the data pad electrode DPE through the second pad hole CT2. The second metal layer 144 of the data pad electrode DPE directly makes contact with the data contact electrode DCE.

In FIG. 1 and FIG. 2, the first pixel electrode PE1 has a plate shape, and the second pixel electrode PE2 includes the slit pattern SLT. Alternatively, although not shown in the figures, the first pixel electrode PE1 may include a slit pattern spaced apart from the slit pattern SLT of the second pixel electrode PE2 and alternately disposed with the slit pattern SLT of the second pixel electrode PE2 to form a horizontal electric field between the first and second pixel electrodes PE1 and PE2.

Hereinafter, a method of manufacturing the display substrate shown in FIG. 2 using a non-halogenated etchant of the present invention will be illustrated in detail referring to FIG. 3A, FIG. 3B, FIG. 3C, FIG. 3D, and FIG. 3E.

FIG. 3A, FIG. 3B, FIG. 3C, FIG. 3D, and FIG. 3E are cross-sectional views illustrating a method of manufacturing the display substrate shown in FIG. 2.

Figure 3A:
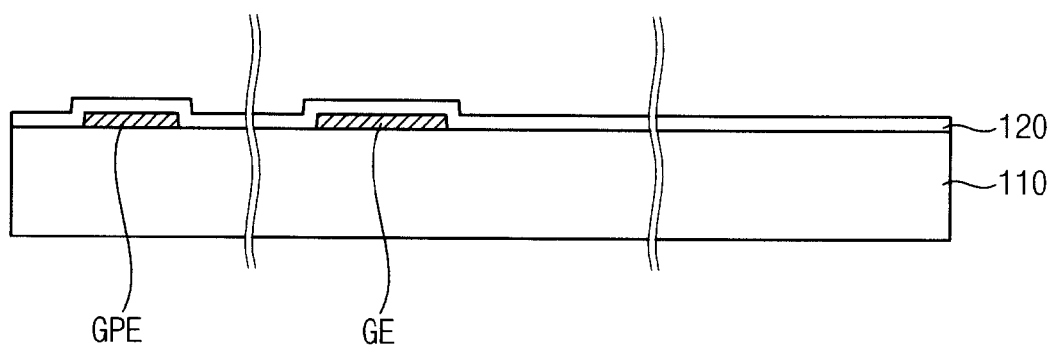
FIG. 3A, FIG. 3B, FIG. 3C, FIG. 3D, and FIG. 3E are cross-sectional views illustrating a method of manufacturing the display substrate shown in FIG. 2.

In particular, FIG. 3A is a cross-sectional view illustrating a process forming the gate electrode GE connected to the gate line GL and the gate pad electrode GPE using a first mask.

Referring to FIG. 3A, the gate metal layer is formed on the base substrate 110 and is patterned to form the gate electrode GE and the gate pad electrode GPE. Particularly, a first photoresist pattern (not shown) is formed on the gate metal layer using the first mask (not shown), and the gate metal layer is etched using the first photoresist pattern as an etching stop layer.

The first insulating layer 120 is formed on the base substrate 110 on which the is gate electrode GE and the gate pad electrode GPE are formed. The first insulating layer 120 may be entirely formed on the base substrate 110. For example, the first insulating layer 120 may include silicon oxide or silicon nitride.

Figure 3B:
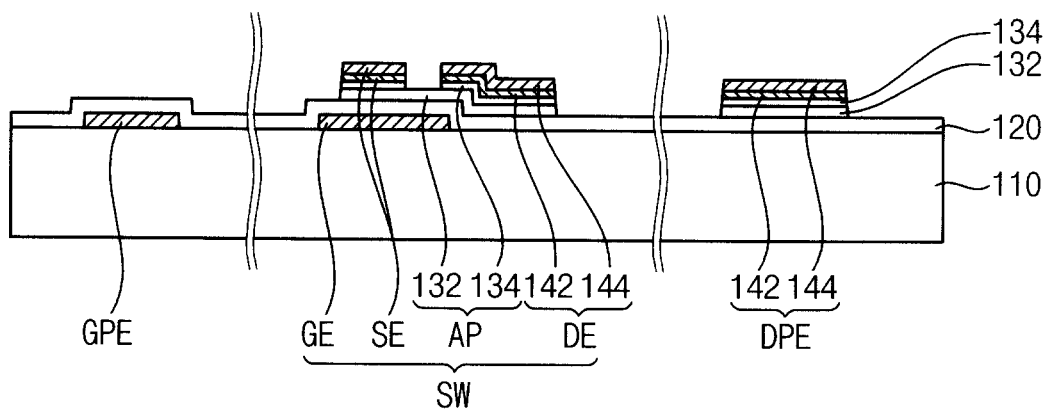

FIG. 3B is a cross-sectional view illustrating a process forming the source electrode SE connected to the data line DL, the drain electrode DE, the data pad electrode DPE, the active pattern AP and the dummy pattern.

Referring to FIG. 3B, the semiconductor layer 132, the ohmic contact layer 134, the first metal layer 142 and the second metal layer 144 are sequentially formed on the base substrate 110 on which the first insulating layer 120. A second photoresist pattern (not shown) may be formed on the second metal layer 144 using a second mask (not shown). The second mask may include a slit portion or a halftone portion. The slit portion or the halftone portion may correspond to a spaced region between the source electrode SE and the drain electrode DE. The second photoresist pattern may include a first thickness portion formed in the spaced region and a second thickness portion formed in regions corresponding to the source electrode SE, the drain electrode DE, the data line DL and the data pad electrode DPE. The second thickness portion may have a smaller thickness than the first thickness portion.

The first and second metal layers 142 and 144 are patterned using the second photoresist pattern as an etching stop layer to form the source electrode SE, the drain electrode DE, the data line DL and the data pad electrode DPE. Simultaneously, the ohmic contact layer 134 and the semiconductor layer 132 are patterned using the second photoresist pattern as an etching stop layer to form the active pattern AP and the dummy pattern.

Figure 3C:
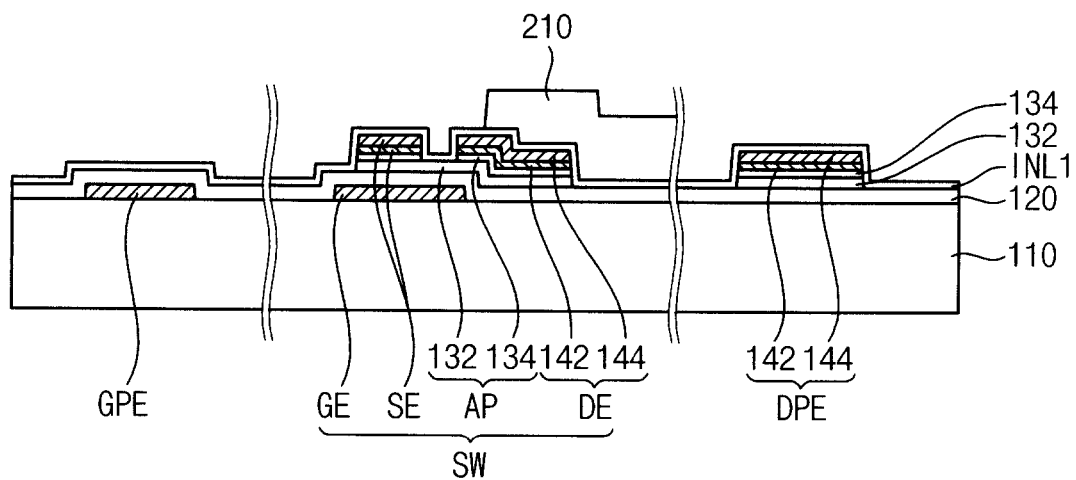

FIG. 3C is a cross-sectional view illustrating a process forming the first pixel electrode PE1 using a third mask.

Referring to FIG. 3C, a first indium oxide layer INL1 is formed on the base substrate 110 on which the source electrode SE, the drain electrode DE, the data line DL and the data pad electrode DPE are formed. A third photoresist pattern 210 is formed on the first indium oxide layer INL1. The third photoresist pattern 210 is formed on the first indium oxide layer INL1 in the pixel region.

The first indium oxide layer INL1 is entirely formed on the base substrate 110 to directly make contact with each of the source electrode SE, the drain electrode DE, the data line DL and the data pad electrode DPE. The first indium oxide layer INL1 directly covers all of upper surfaces and side surfaces of each of the source electrode SE, the drain electrode DE, the data line DL and the data pad electrode DPE. The first indium oxide layer INL1 may include indium zinc oxide (IZO) and indium tin oxide (ITO), etc. The first indium oxide layer INL1 may be amorphous.

The first indium oxide layer INL1 is etched using the third photoresist pattern 210 as an etching stop layer and an etchant. The etchant for etching the first indium oxide layer INL1 is a non-halogenated etchant, and the non-halogenated etchant includes nitric acid, sulfuric acid, a corrosion inhibitor including ammonium ($NH_4^+$), a cyclic amine based compound and water. The non-halogenated etchant for etching the first indium oxide layer is substantially the same as the non-halogenated etchant described above according to the present invention. Thus, any repetitive descriptions will be omitted. The non-halogenated etchant includes the cyclic amine based compound and does not include the halogenated compound, so that the non-halogenated etchant may prevent the second metal layer 144 from being damaged although the second metal layer 144 including copper is exposed to the non-halogenated etchant during etching of the first indium oxide layer INL1.

Although not shown in the figures, when the first indium oxide layer INL1 is amorphous, the first indium oxide layer INL1 may be thermally heated after being patterned by the non-halogenated etchant. The amorphous indium oxide is crystallized by being thermally heated.

Figure 3D:
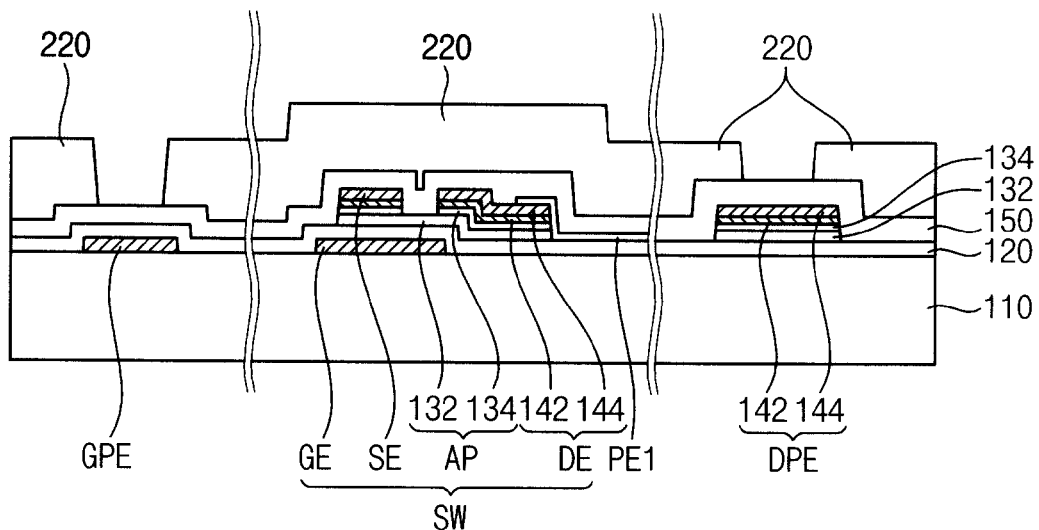

FIG. 3D is a cross-sectional view illustrating a process for patterning the first and second insulating layers 120 and 150 using a fourth mask.

Referring to FIG. 3D, the second insulating layer 150 is formed on the base substrate 110 including the first pixel electrode PE1 formed via etching the first indium oxide layer INL1 by the non-halogenated etchant. The first pixel electrode PE1 directly makes contact with a portion of an upper surface of the drain electrode DE and a side surface of the drain electrode DE.

A fourth photoresist pattern 220 is formed on the second insulating layer 150 using a fourth mask. The fourth photoresist pattern 220 is entirely formed on the base substrate 110 except for regions in which the gate pad electrode GPE and the data pad electrode DPE are formed. Then, the second insulating layer 150 on the gate pad electrode GPE and the data pad electrode DPE are exposed through the fourth photoresist pattern 220.

The first and second insulating layers 120 and 150 on the gate pad electrode GPE and the second insulating layer 150 on the data pad electrode DPE are removed using the fourth photoresist pattern 220 as an etching stop layer.

Figure 3E:
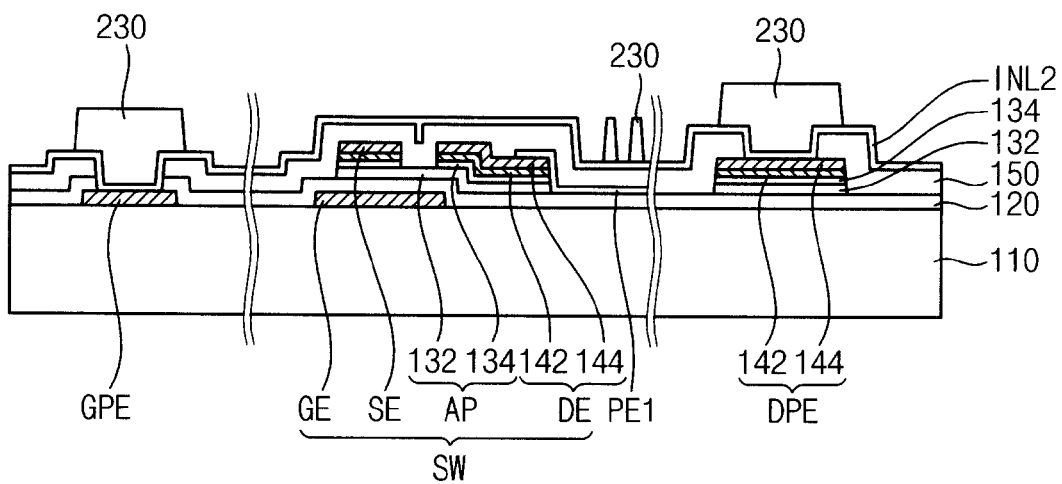

FIG. 3E is a cross-sectional view illustrating a process for forming the second pixel electrode PE2, the gate contact electrode GCE and the data contact electrode DCE using a fifth mask.

Referring to FIG. 3E, a second indium oxide layer INL2 is formed on the base is substrate 110 on which the first pad hole CT1 and the second pad hole CT2. The first pad hole CT1 is formed using the fourth photoresist pattern 220 and partially exposes the gate pad electrode GPE. The second pad hole CT2 is formed using the fourth photoresist pattern 220 and partially exposes the data pad electrode DPE. The second indium oxide layer INL2 may include indium zinc oxide (IZO) or indium tin oxide (ITO). The second indium oxide layer INL2 may be amorphous or crystallized.

A fifth photoresist pattern 230 is formed on the second indium oxide layer INL2 using the fifth photoresist mask. The fifth photoresist pattern 230 is formed on the second indium oxide layer INL2 in the pixel region and regions in which the gate pad electrode GPE and the data pad electrode DPE are formed.

The fifth photoresist pattern 230 includes a plurality of holes formed in the pixel region. The second indium oxide layer INL2 exposed through the holes is removed and the second indium oxide layer INL2 under the fifth photoresist pattern 230 remains on the base substrate 110 to form the second pixel electrode PE2 including the slit pattern.

The second indium oxide layer INL2 between the gate pad electrode GPE and the fifth photoresist pattern 230 remains on the base substrate 110 to form the gate contact electrode GCE. The second indium oxide layer INL2 between the fifth photoresist pattern 230 and the data pad electrode DPE remains on the base substrate 110 to form the data contact electrode DCE. Thus, the gate contact electrode GCE directly makes contact with the gate pad electrode GPE through the first pad hole CT1, and the data contact electrode DCE directly makes contact with the data pad electrode DPE through the second pad hole CT2.

Therefore, the display substrate 100 shown in FIG. 1 and FIG. 2 is manufactured.

According to the present exemplary embodiment, the first indium oxide layer INL1 is directly formed on the base substrate 110 on which the source electrode SE, the drain electrode DE and the data pad electrode DPE are formed without additionally forming an insulating layer, and the first indium oxide layer INL1 is patterned using the non-halogenated etchant of the present invention to form the first pixel electrode PE1 so that the second metal layer 144 may be prevented from being damaged by the etchant. Although the second metal layer 144 includes a copper layer, the damage of the second metal layer 144 by the non-halogenated etchant may be minimized. In the present exemplary embodiment, the first metal layer 142 includes a titanium layer and the second metal layer 144 includes the copper layer. Alternatively, when the first metal layer 142 may include a molybdenum layer and the second metal layer 144 may include an aluminum layer, the second metal layer 144 may be also prevented from being damaged by the non-halogenated etchant.

Figure 4:
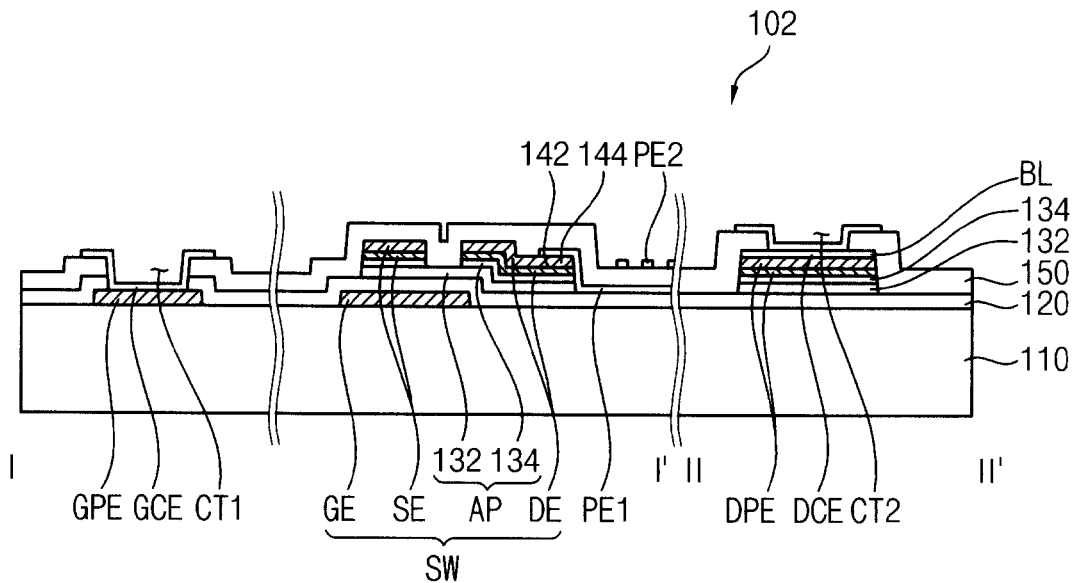
FIG. 4 is a cross-sectional view illustrating a display substrate manufactured according to an exemplary embodiment of the present invention.

FIG. 4 is a cross-sectional view illustrating a display substrate manufactured according to an exemplary embodiment of the present invention.

A display substrate 102 shown in FIG. 4 is substantially the same as the display substrate 100 illustrated in FIG. 1 and FIG. 2 except that it further includes a buffer electrode BL formed between a data pad electrode DPE and a data contact electrode DCE. Thus, any repetitive descriptions will be omitted.

Referring to FIG. 4, the display substrate 102 includes a switching element SW, a gate pad electrode GPE, the data pad electrode DPE, a gate contact electrode GCE, the data contact electrode DCE, the buffer electrode BL, a first pixel electrode PE1 and a second pixel electrode PE2.

An active pattern AP of the switching element SW is formed on a first insulating layer 120 covering a gate electrode GE of the switching element SW. A source electrode SE and is a drain electrode DE of the switching element SW are formed on the active pattern AP. A buffer pattern having substantially the same layered structure as the active pattern AP is formed under the data pad electrode DPE. Each of the data pad electrode DPE, the source electrode SE and the drain electrode DE includes a first metal layer 142 including a titanium layer and a second metal layer 144 including a copper layer.

The buffer electrode BL is formed on the second metal layer 144 of the data pad electrode DPE using substantially the same metal layer as the first pixel electrode PE1. The second pixel electrode PE2 is formed on a second insulating layer 150 covering the first pixel electrode PE1. The gate pad electrode GPE exposed through a first pad hole CT1 of the first and second insulating layers 120 and 150 directly makes contact with the gate contact electrode GCE. The buffer electrode BL is exposed through a second pad hole CT2 of the second insulating layer 150 and directly makes contact with the data contact electrode DCE through the second pad hole CT2. The buffer electrode BL covers the second metal layer 144 of the data pad electrode DPE in a process of forming the data contact electrode DCE so that the second meal layer 144 may be prevented from being damaged in the process of forming the data contact electrode DCE.

Figure 5:
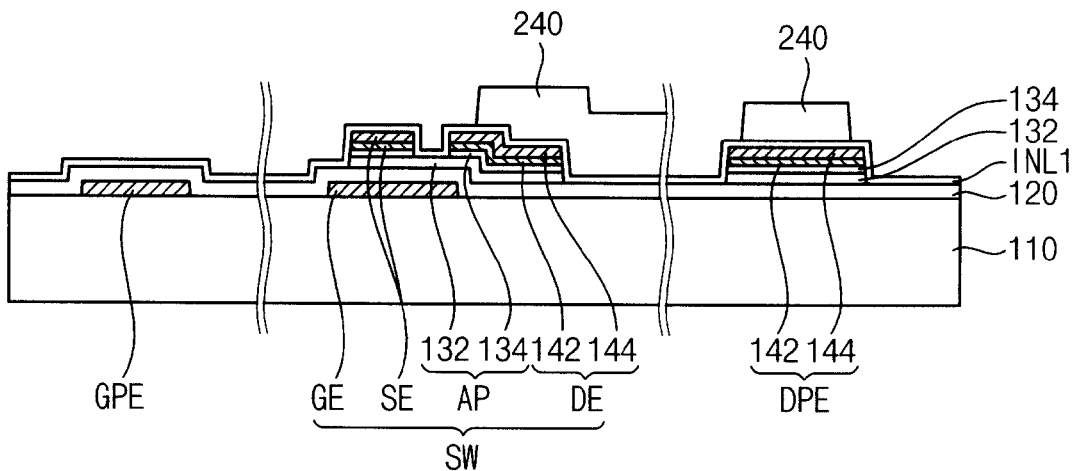
FIG. 5 is a cross-sectional view illustrating a method of manufacturing the display substrate shown in FIG. 4.

FIG. 5 is a cross-sectional view illustrating a method of manufacturing the display substrate shown in FIG. 4.

A method of manufacturing the display substrate 102 illustrated in FIG. 2 includes substantially the same processes as illustrated referring to FIG. 3A and FIG. 3B until forming the first indium oxide layer INL1. Thus, any repetitive descriptions will be omitted.

Referring to FIG. 5, the first indium oxide layer INL1 is formed on the base substrate 110 on which the source electrode SE, the drain electrode DE and the data pad is electrode DPE are formed. A photoresist pattern 240 is formed on the first indium oxide layer INL1. The photoresist pattern 240 shown in FIG. 5 is substantially the same as the third photoresist pattern illustrated in FIG. 3C except it includes a photo pattern formed on the first indium oxide layer INL1 in a region in which the data pad electrode DPE is formed.

The first indium oxide layer INL1 is patterned using the photoresist pattern 240 as an etching stop layer. An etchant for etching the first indium oxide layer INL1 includes a non-halogenated etchant. The non-halogenated etchant includes nitric acid, sulfuric acid, a corrosion inhibitor including ammonium ($NH_4^+$), a cyclic amine based compound and water. The non-halogenated etchant does not include a halogenated compound. The non-halogenated etchant etching the first indium oxide layer INL1 is the same as the non-halogenated etchant of the indium oxide layer of the present invention described above, and thus any repetitive descriptions will be omitted. The first indium oxide layer INL1 is etched using the photoresist pattern 240 to form the first pixel electrode PE1 and the buffer electrode BL.

The second insulating layer 150, the second pixel electrode PE2, the gate contact electrode GCE and the data contact electrode DCE, which are formed on the first pixel electrode PE1 and the buffer electrode BL and are illustrated in FIG. 4, are formed via substantially the same processes illustrated in FIG. 3D and FIG. 3E except that the data contact electrode DCE directly makes contact with the buffer electrode BL.

Therefore, the display substrate 102 illustrated in FIG. 4 is manufactured.

Figure 6:
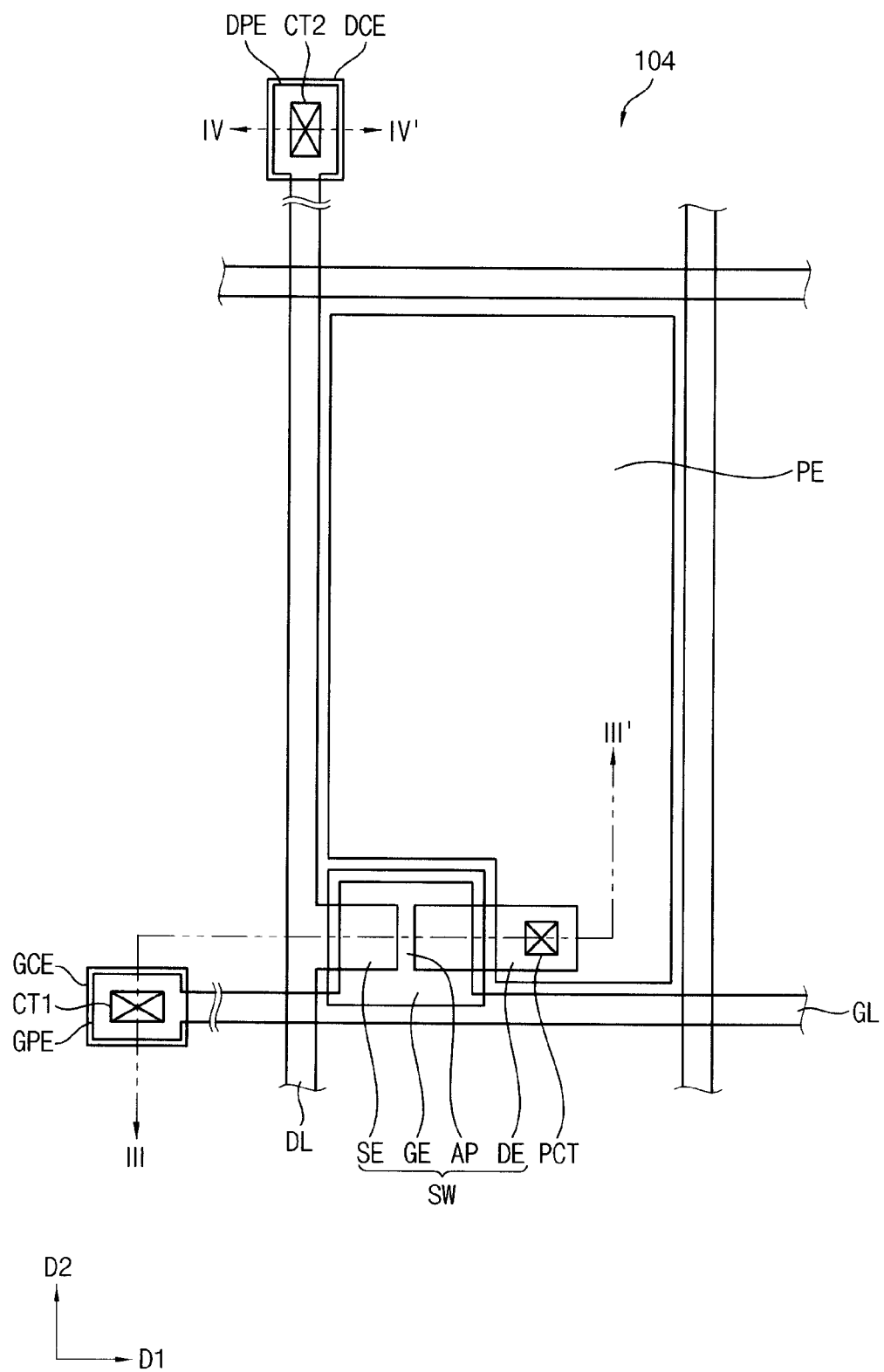
FIG. 6 is a plan view illustrating a display substrate manufactured according to an exemplary embodiment of the present invention.

FIG. 6 is a plan view illustrating a display substrate manufactured according to an exemplary embodiment of the present invention.

Figure 7:
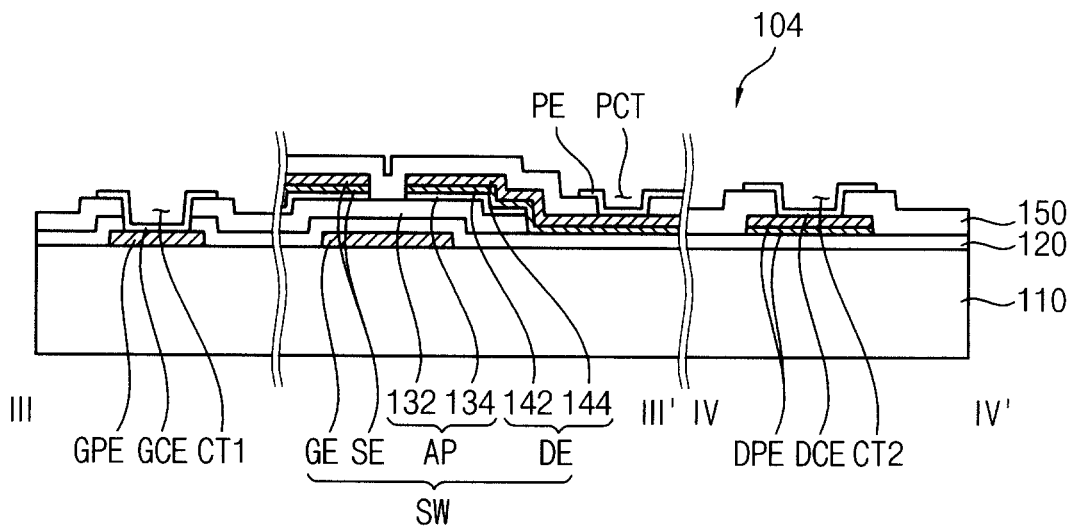
FIG. 7 is a cross-sectional view taken along line III-III' and line IV-IV' in FIG. 6.

FIG. 7 is a cross-sectional view taken along a line III-III' and a line IV-IV' in FIG. 6.

Referring to FIG. 6 and FIG. 7, a display substrate 104 includes a gate line GL, a data line DL, a switching element SW and a pixel electrode PE. The display substrate 104 further includes a gate pad electrode GPE and a data pad electrode DPE.

The gate line GL extends along a first direction D1 and has a rectangular shape extending in the first direction D1. The data line DL extends along a second direction D2 different from the first direction D2 and has a rectangular shape extending in the second direction D2.

The switching element SW is electrically connected to the gate line GL and the data line DL. The switching element SW includes a gate electrode GE, an active pattern AP, a source electrode SE and a drain electrode DE. The drain electrode DE directly makes contact with the pixel electrode PE so that the switching element SW is electrically connected to the pixel electrode PE.

Each of the source electrode SE connected to the data line DL, the drain electrode DE spaced apart from the source electrode SE, and the data pad electrode DPE includes a first metal layer 142 and a second metal layer 144. For example the first metal layer 142 may include a titanium layer and the second metal layer 144 may include a copper layer.

A first insulating layer 120 is formed between the gate electrode GE and the active pattern AP. The first insulating layer 120 may insulate the gate line GL from the data line DL. A second insulating layer 150 is formed on the source electrode SE, the drain electrode DE and the data pad electrode DPE. The gate pad electrode GPE is partially exposed through a first pad hole CT1 formed through the first and second insulating layer 120 and 150, and the data pad electrode DPE is partially exposed through a second pad hole CT2 formed through the second insulating layer 150. In addition, the second insulating layer 150 further includes a contact hole PCT partially exposing the drain electrode DE.

The pixel electrode PE is formed on the second insulating layer 150 and directly makes contact with the drain electrode DE through the contact hole PCT. A gate contact electrode GCE is formed on the gate pad electrode GPE to make contact with the gate pad electrode GPE through the first pad hole CT1. A data contact electrode DCE is formed on the data pad electrode DPE to make contact with the data pad electrode DPE through the second pad hole CT2. The data pad electrode DPE is directly formed on the first insulating layer 120.

Figure 8A:
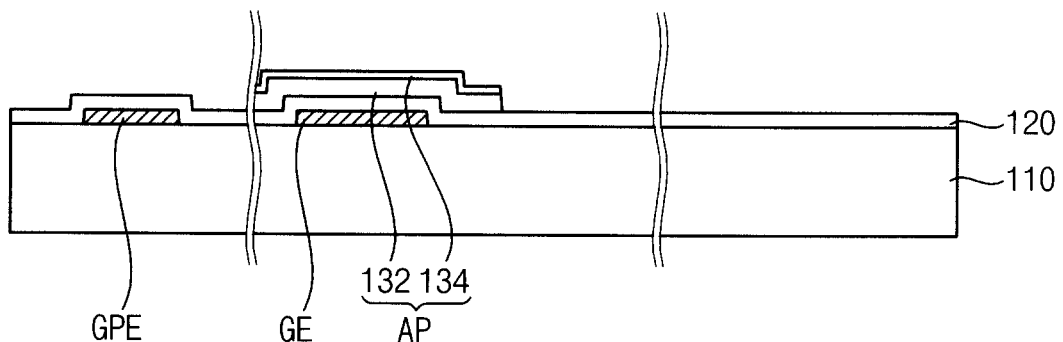
FIG. 8A, FIG. 8B, and FIG. 8C are cross-sectional views illustrating a method of manufacturing the display substrate shown in FIG. 7.
Figure 8B:
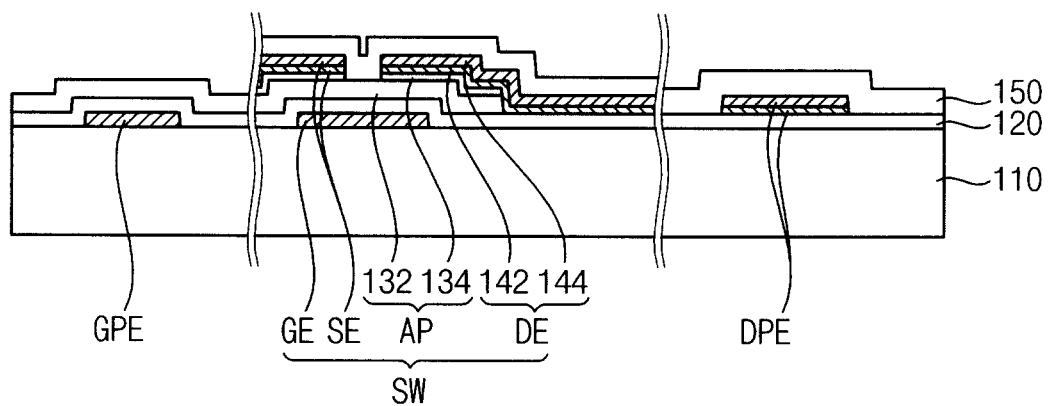
Figure 8C:
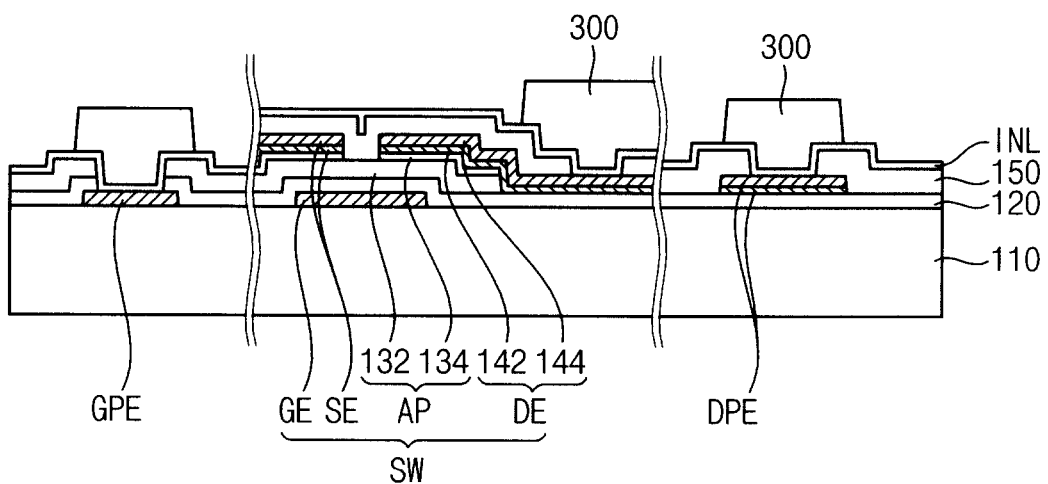

FIG. 8A, FIG. 8B, and FIG. 8C are cross-sectional views illustrating a method of manufacturing the display substrate shown in FIG. 7.

Referring to FIG. 8A, the gate electrode GE and the gate pad electrode GPE are formed using a first mask (not shown). The first insulating layer 120 is formed on the base substrate 110 on which the gate electrode GE and the gate pad electrode GPE are formed, and a semiconductor layer 132 and an ohmic contact layer 134 are formed using a second mask (not shown).

Referring to FIG. 8B, the source electrode SE, the drain electrode DE and the data pad electrode DPE are formed using a third mask (not shown) on the base substrate 110 on which the active pattern AP is formed. In particular, the first and second metal layers 142 and 144 are sequentially formed on the base substrate 110 on which the active pattern AP is formed, and a first photo pattern is formed on the second metal layer 144 using the third mask. The first and second metal layer 142 and 144 are etched using the first photo pattern as an etching stop layer.

Then, the second insulating layer 150 is formed on the base substrate 110 on which the source electrode SE, the drain electrode DE and the data pad electrode DPE are is formed.

Referring to FIG. 8C, a second photo pattern is formed on the second insulating layer 150 using a fourth mask (not shown), and the first and second pad holes CT1 and CT2 and the contact hole PCT are formed using the second photo pattern.

Then, an indium oxide layer INL is formed on the base substrate 110 on which the contact hole PCT is formed, and a third photo pattern 300 is formed using a fifth mask (not shown). The third photo pattern 300 is formed in a pixel region and regions in which the gate pad electrode GPE and the data pad electrode DPE are formed. The indium oxide layer INL is patterned using the third photo pattern 300 as an etching stop layer to form the pixel electrode PE.

The indium oxide layer INL is etched using a non-halogenated etchant. The non-halogenated etchant includes nitric acid, sulfuric acid, a corrosion inhibitor including ammonium (NH4+), a cyclic amine based compound and water. For example, based on a total weight of the non-halogenated etchant, an amount of nitric acid is between about 1% by weight and about 10% by weight, an amount of sulfuric acid is between about 1% by weight and about 10% by weight, an amount of the corrosion inhibitor is between about 0.1% by weight and about 5% by weight, an amount of the cyclic amine based compound is between about 0.1% by weight and about 5% by weight. A remainder excluding nitric acid, sulfuric acid, the corrosion inhibitor and the cyclic amine based compound in the non-halogenated etchant is water. The non-halogenated etchant is substantially the same as the above-described non-halogenated etchant of the present invention. According to use the non-halogenated etchant, the second metal layer 144 may be prevented from being corroded during etching the indium oxide layer INL. Although not shown in figures, when the indium oxide layer INL is amorphous, the indium oxide layer INL is thermally heated after being patterned using the non-halogenated etchant. The amorphous indium oxide is crystallized by being thermally heated.

In FIG. 7, FIG. 8A, FIG. 8B, and FIG. 8C, the second mask for forming the active pattern AP is different from the third mask for forming the source electrode SE, the drain electrode DE and the data pad electrode DPE. Alternatively, a single mask may be formed for forming the active pattern AP with the source electrode SE, the drain electrode DE and the data pad electrode DPE, as illustrated in FIG. 3B.

Figure 9:
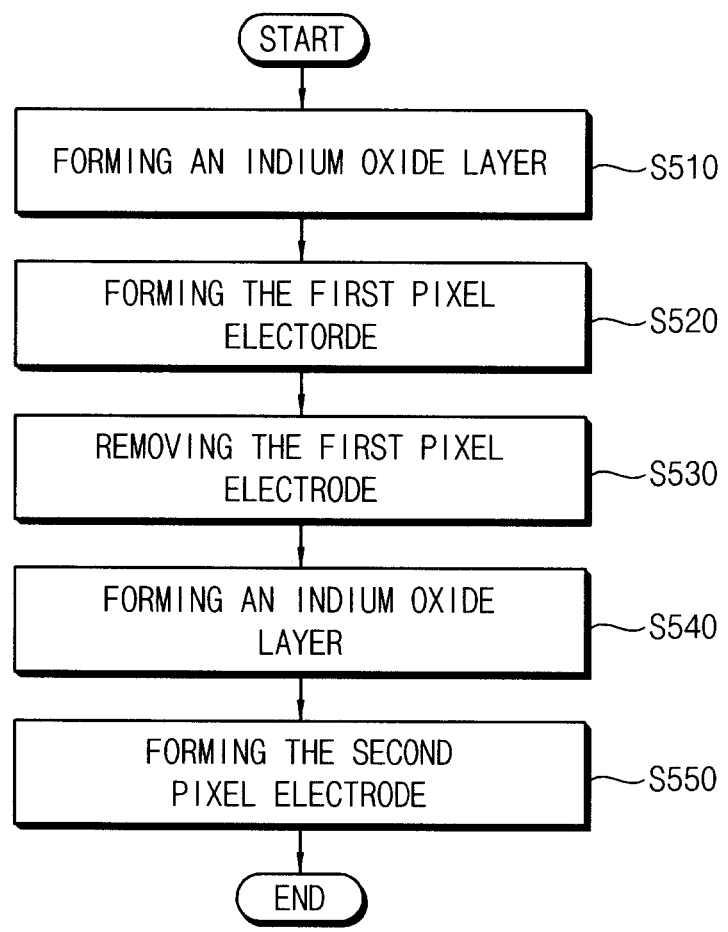
FIG. 9 is a flow chart illustrating a method of manufacturing the display substrate shown in FIG. 7 according to an exemplary embodiment of the present invention.

FIG. 9 is a flow chart illustrating a method of manufacturing the display substrate shown in FIG. 7 according to an exemplary embodiment of the present invention.

"Second pixel electrode" referred in FIG. 9 is substantially the same as the pixel electrode PE illustrated in FIG. 7. In addition, in the method of manufacturing the display substrate 102 shown in FIG. 7 according to the present exemplary embodiment, processes until forming the first and second pad holes CT1 and CT2 and the contact hole PCT are substantially the same as the above-mentioned processes, and "forming an indium oxide layer (Step S510) in FIG. 9 is substantially the same as the process forming the indium oxide layer INL illustrated referring to FIG. 8C.

Referring to FIGS. 8C and 9, a first indium oxide layer (not shown) is formed on the base substrate 110 on which the first pad hole CT1, the second pad hole CT2 and the contact hole PCT (Step S510). The first indium oxide layer is patterned to form "first pixel electrode" (Step S520). For example, the first pixel electrode is formed via etching the first indium oxide layer using a non-halogenated etchant including nitric acid, sulfuric acid, a corrosion inhibitor including ammonium ($NH_4^+$), a cyclic amine based compound and water. Then, when the first pixel electrode does not have uniform thickness in a pixel or when a surface of the first pixel is electrode is damaged, a reliability of a product having the faulty first pixel electrode may be decreased, and a substrate having the faulty first pixel electrode may be discarded, which may decease manufacturing productivity. In order to solve the above problems, the faulty first pixel electrode is selectively removed to recycle the substrate (Step S530). The first pixel electrode is removed using a non-halogenated etchant including nitric acid, sulfuric acid, a corrosion inhibitor including ammonium ($NH_4^+$), a cyclic amine based compound and water and not including a halogenated compound so that the first pixel electrode may be fully removed without the residues of the pixel electrode. In addition, the non-halogenated etchant may prevent an exposed pattern, for example a metal layer exposed through the first and second pad holes CT1 and CT2 and the contact hole PCT, from being damaged. Particularly, all of an aluminum layer of the gate pad electrode GPE exposed through the first pad hole CT1, a copper layer of the data pad electrode DPE exposed through the second pad hole CT2 and a copper layer of the drain electrode DE exposed through the contact hole PCT may not be corroded by the halogenated compound.

After removing the first pixel electrode, an indium oxide layer is again formed on the base substrate 110 on which the first and second pad holes CT1 and CT2 and the contact hole PCT are formed (Step S540), and the indium oxide layer is patterned to form the "second pixel electrode" as a pixel electrode PE shown in FIG. 7 (Step S550). Then, the second pixel electrode may be also formed using the non-halogenated etchant.

Although not shown in figures, when the pixel electrode PE as the second pixel electrode shown in FIG. 7 is faulty, the second pixel electrode may be removed using the non-halogenated etchant and an indium oxide layer is formed again. The indium oxide layer may be patterned using the non-halogenated etchant to form a "third pixel electrode." Thus, a faulty is substrate may be recycled to improve the productivity and the reliability in forming the display substrate 102.

According to the present exemplary embodiment, the non-halogenated etchant for etching the indium oxide layer may minimize the damage to a lower layer to improve the reliability in forming the display substrate 102. In addition, the non-halogenated etchant may be used in removing the faulty pixel electrode for recycling the substrate so that the lower layer may not be damaged in removing the faulty pixel electrode although the non-halogenated etchant makes contact with the lower layer of the pixel electrode.

Hereinafter, etchants according to Examples 1 to 4 of the present invention and according to Comparative Examples 1 and 2 are prepared according to the following Table 1 and Table 2, and the results obtained by experiments for a characteristic evaluation are illustrated the following.

EXAMPLES 1 TO 4

The etchants according to Examples 1 to 4 of the present invention were prepared according to the following Table 1.

TABLE 1

|  | Nitric acid (% by weight) | Sulfuric acid (% by weight) | ammonium sulfate (% by weight) | Benzotriazole (% by weight) | Water (% by weight) |
|---|---|---|---|---|---|
| Example 1 | 9 | 5 | 1 | 0.5 | 84.5 |
| Example 2 | 7 | 5 | 1 | 0.5 | 86.5 |
| Example 3 | 10 | 5 | 1.5 | 0.5 | 83 |
| Example 4 | 7 | 5 | 1 | 1 | 86 |

COMPARATIVE EXAMPLES 1 AND 2

The etchants according to Comparative Examples 1 and 2 were prepared according to the following Table 2.

TABLE 2

|  | Nitric acid (% by weight) | Sulfuric acid (% by weight) | Hydrochloric acid (% by weight) | ammonium sulfate (% by weight) | Benzotriazole (% by weight) | Water (% by weight) |
|---|---|---|---|---|---|---|
| Comparative Example 1 | 7 | 5 | 0 | 1 | 0 | 87 |
| Comparative Example 2 | 10 | 5 | 2 | 1 | 0.5 | 82.5 |

EXPERIMENT 1

Evaluation of an Etching Ability for an Indium Oxide Layer

A photo pattern was formed on a substrate on which a metal pattern including copper and an indium zinc oxide (IZO) layer covering a whole surface except for a surface contacting the metal pattern and having a thickness of about 550 Å were sequentially formed. After the IZO layer was patterned using the photo pattern as an etching stop layer and the etchant according to Example 1, a skew length between an end portion of the photo pattern and an etched surface of the IZO layer according to an etching time was measured. Thus, obtained results are illustrated in a graph A of FIG. 10.

In addition, a photo pattern was formed on a substrate on which a metal pattern including copper and an IZO layer covering a whole surface except for a surface contacting the metal pattern and having a thickness of about 550 Å were sequentially formed. After the IZO layer was patterned using the photo pattern as an etching stop layer and the etchant according to Comparative Example 1, a skew length between an end portion of the photo pattern and an is etched surface of the IZO layer according to an etching time was measured. Thus, obtained results are illustrated in a graph B of FIG. 10.

Figure 10:
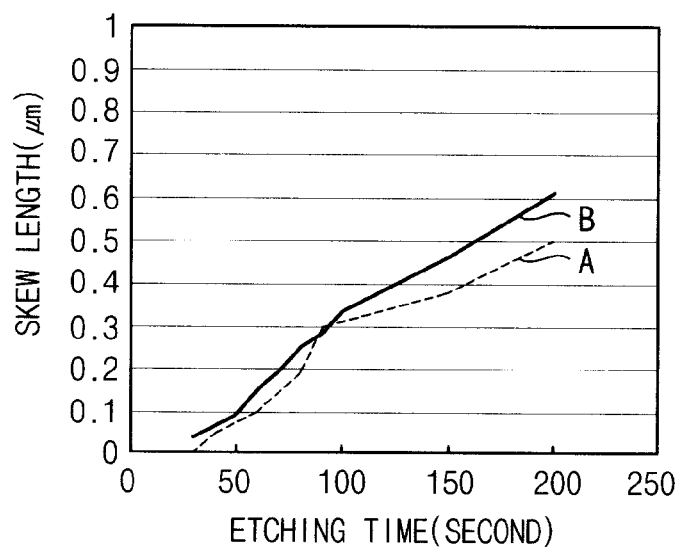
FIG. 10 is a graph illustrating a skew length according to an etching time when an is indium oxide layer is etched using an etchant according to Example 1 of the present invention and an etchant according to Comparative Example 1.

FIG. 10 is a graph illustrating a skew length according to an etching time when an indium oxide layer is etched using each of an etchant according to Example 1 of the present invention and an etchant according to Comparative Example 1. In FIG. 10, an x axis refers to an etching time (unit: seconds) and a y axis refers to an average value of skew lengths (unit: μm).

Referring to FIG. 10, the graph A represents that each of the skew lengths is about 0.01 μm, about 0.05 μm, about 0.19 μm, about 0.29 μm, about 0.38 μm and about 0.5 μm as each of the etching times is respectively about 30 seconds, about 80 seconds, about 90 seconds, about 150 seconds and about 200 seconds. Regarding the etchant according to Example 1, the skew length is lengthened as the etching time is increased. Thus, as the etching time is increased, the etched surface of the IZO layer formed under the photo pattern is continuously etched by the etchant according to Example 1 to relatively depress the etched surface of the IZO layer compared to the end portion of the photo pattern, so that an under cut is formed between the photo pattern and the IZO layer.

The graph B represents that each of the skew lengths is about 0.04 μm, about 0.07 μm, about 0.09 μm, about 0.15 μm, about 0.19 μm, about 0.25 μm, about 0.28 μm, about 0.33 μm, about 0.46 μm and about 0.61 μm as each of the etching times is respectively about 30 seconds, about 40 seconds, about 50 seconds, about 60 seconds, about 70 seconds, about 80 seconds, about 90 seconds, about 100 seconds, about 150 seconds and about 200 seconds. Regarding the etchant according to Comparative Example 1, the skew length is lengthened as the etching time is increased, similar to the etchant according to Example 1.

Although the skew length in the graph A is relatively shorter than the skew length in the graph B, ranges of the graph A and the graph B may be included in substantially an equal effective range. Thus, it can be noted that the etchant of the present invention may have an etching ability of equal level to Comparative Example 1 to etch the IZO layer.

In addition, when experiments for the etching ability of the IZO layer using etchants according to Examples 2 to 4 are performed, graphs of the etchants according to Examples 2 to 4 may have also a similar tendency to the graph B shown in FIG. 10.

EXPERIMENT 2

Evaluation of an Etching Ability for an Indium Oxide Layer

A photo pattern was formed on a substrate on which a metal pattern including copper and an indium zinc oxide (IZO) layer covering a whole surface except for a surface contacting the metal pattern and having a thickness of about 550 Å were sequentially formed. After the IZO layer was patterned using the photo pattern as an etching stop layer and the etchant according to Example 1, a taper angle as a slope of an etched surface of the IZO layer according to an etching time was measured. Thus, obtained results are illustrated in a bar graph C of FIG. 11.

In addition, a photo pattern was formed on a substrate on which a metal pattern including copper and an indium zinc oxide (IZO) layer covering a whole surface except for a surface contacting the metal pattern and having a thickness of about 550 Å were sequentially formed. After the IZO layer was patterned using the photo pattern as an etching stop layer and the etchant according to Comparative Example 1, a taper angle as a slope of an etched surface of the IZO layer according to an etching time was measured. Thus, obtained results are illustrated in a bar graph D of FIG. 11.

Figure 11:
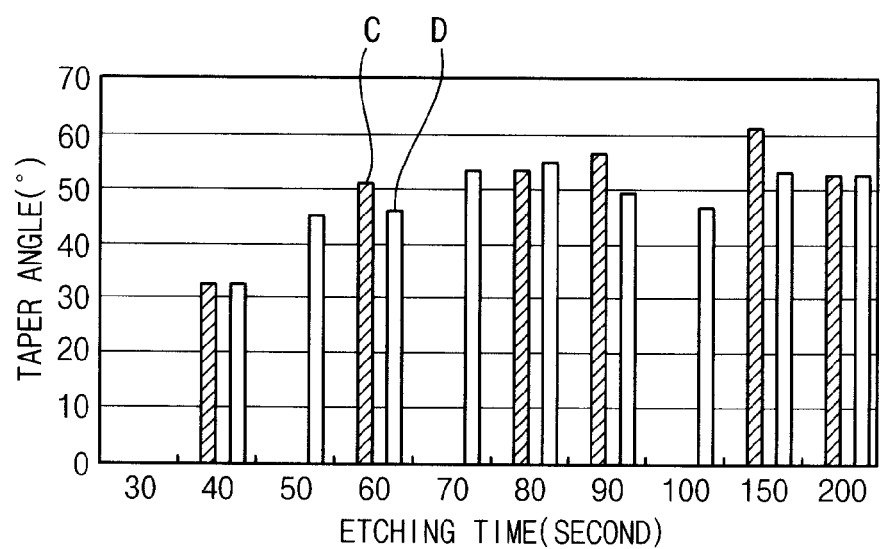
FIG. 11 is a graph illustrating a taper angle of a lower copper layer according to an etching time when an indium oxide layer is etched using the etchant according to Example 1 of the present invention and the etchant according to Comparative Example 1.

FIG. 11 is a graph illustrating a taper angle of a lower copper layer according to is an etching time when an indium oxide layer is etched using each of the etchant according to Example 1 of the present invention and the etchant according to Comparative Example 1. In FIG. 11, an x axis refers to an etching time (unit: seconds) and a y axis refers to a taper angle (unit: degrees (°)).

Referring to FIG. 11, when the bar graph C and the bar graph D are compared to each other in the same etching time, the bar graph C represents nearly similar tendency to the bar graph D. Although the etchant of the present invention includes a cyclic diamine compound, the taper angle of the metal pattern etched by the etchant according to Example 1 has a substantially equal level to the taper angle of the metal pattern etched by the etchant according to Comparative Example 1. In addition, when experiments for the etching ability of the IZO layer using etchants according to Examples 2 to 4 are performed, graphs of the etchants according to Examples 2 to 4 may have also a similar tendency to the bar graphs C or D shown in FIG. 11.

EXPERIMENT 3

Evaluation of an anticorrosive ability of a lower layer

For each of a first sample including a silicon nitride layer, an IZO layer and a photo pattern sequentially formed on a substrate and a second sample including a copper layer, an IZO layer and a photo pattern sequentially formed on a substrate, the etchant according to Example 1 etched the IZO layer of each of the first and second samples according to an etching time. After removing the photo pattern, a surface of the IZO layer and a surface of the copper layer exposed to the etchant according to Example 1 were taken pictures using a scanning electron microscope (SEM). Thus, obtained results are illustrated in FIG. 12.

In addition, the IZO layer of each of the first and second samples was etched by the etchant according to Comparative Example 1. After removing the photo pattern in the first and second samples, a surface of the IZO layer and a surface of the copper layer exposed to the etchant according to Comparative Example 1 were taken pictures using a SEM. Thus, obtained results are illustrated in FIG. 13.

Figure 12:
FIG. 12 is a table including scanning electron microscope (SEM) pictures illustrating an etching result of the indium oxide layer and a surface condition of the copper layer when the indium oxide layer is etched using the etchant according to Example 1 of the present invention.
Figure 12:
Figure 12:
Figure 12:
Figure 12:
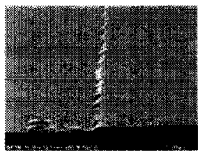
Figure 12:
Figure 12:
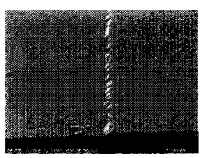
Figure 12:
Figure 12:
Figure 12:
Figure 12:
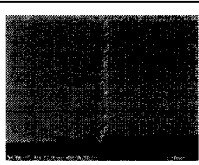
Figure 12:
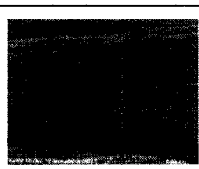
Figure 12:
Figure 12:
Figure 12:
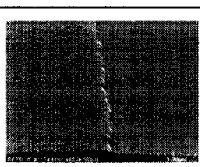
Figure 12:
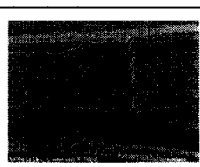

FIG. 12 is a table including SEM pictures illustrating an etching result of the indium oxide layer and a surface condition of the copper layer when the indium oxide layer is etched using the etchant according to Example 1 of the present invention. FIG. 13 is a table including SEM pictures illustrating an etching result of the indium oxide layer and a surface condition of the copper layer when the indium oxide layer is etched using the etchant according to Comparative Example 1.

Figure 13:
FIG. 13 is a table including SEM pictures illustrating an etching result of the indium oxide layer and a surface condition of the copper layer when the indium oxide layer is etched using the etchant according to Comparative Example 1.
Figure 13:
Figure 13:
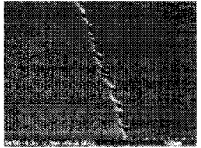
Figure 13:
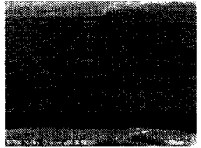
Figure 13:
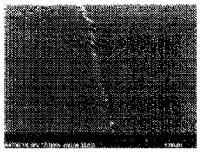
Figure 13:
Figure 13:
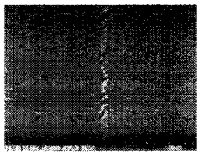
Figure 13:
Figure 13:
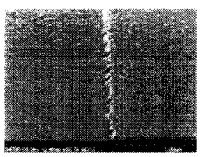
Figure 13:
Figure 13:
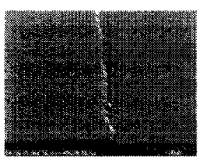
Figure 13:
Figure 13:
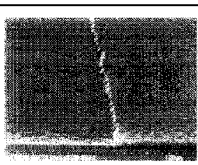
Figure 13:
Figure 13:
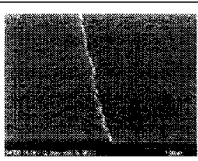
Figure 13:
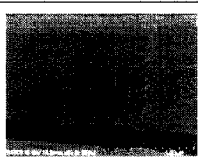

In the pictures of the etching result of the IZO layer of FIG. 12 and FIG. 13, a portion shown relatively higher than other portions is the residue of the IZO layer, and a portion shown relatively lower than other portions is the silicon nitride layer exposed via removing the IZO layer. In addition, in the pictures of the surface condition of the copper layer in FIG. 12 and FIG. 13, a portion shown relatively higher than other portions is the residue of the IZO layer and a portion shown relatively lower than other portions is the copper layer exposed to the etchant.

Referring to FIG. 12 and FIG. 13, the etching result of the IZO layer for each of the etchant according to Example 1 and the etchant according to Comparative Example 1 is not greatly changed. Thus, it can be noted that the etchant according to Example 1 do not greatly change etching characteristics of the IZO layer, for example a straight characteristic, and do not cause damage to the IZO layer, like the etchant according to Comparative Example 1.

In contrast, regarding the surface condition of the copper layer, the surface condition of the copper layer exposed to the etchant according to Example 1 is not changed although the etching time is increased. The surface condition of the copper layer exposed to the etchant according to Comparative Example 1 is greatly corroded as the etching time is increased.

EXPERIMENT 4

Evaluation of an anticorrosive ability of a lower layer

For a substrate on which a titanium pattern, a metal pattern including copper and an IZO layer entirely covering the substrate were sequentially formed, the etchant according to Example 1, the etchants according to Comparative Examples 1 and 2 were provided to the substrate during about 5 minutes, about 10 minutes and about 15 minutes to remove the IZO layer. A distance between an end portion of the titanium pattern and an end portion of the metal pattern was measured and a surface of the metal pattern was taken a picture using a SEM. Thus, obtained results are illustrated in FIG. 14A, FIG. 14B, FIG. 14C, FIG. 14D, FIG. 15A, FIG. 15B, FIG. 15C, FIG. 15D, FIG. 16A, FIG. 16B, FIG. 16C, and FIG. 16D.

FIG. 14A, FIG. 14B, FIG. 14C and FIG. 14D are SEM pictures illustrating a surface condition of the copper layer according to a time for which the copper layer contacts with the etchant according to Example 1 of the present invention.

Figure 14A:
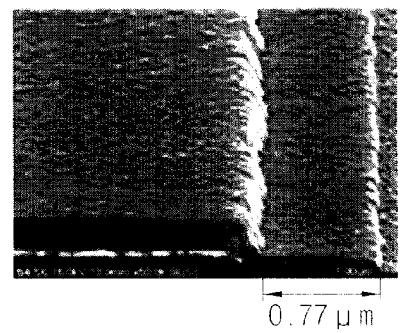
FIG. 14A, FIG. 14B, FIG. 14C, and FIG. 14D are SEM pictures illustrating a surface condition of the copper layer according to a time for which the copper layer contacts with the etchant according to Example 1 of the present invention.
Figure 14B:
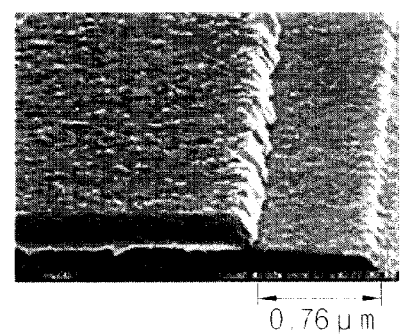
Figure 14C:
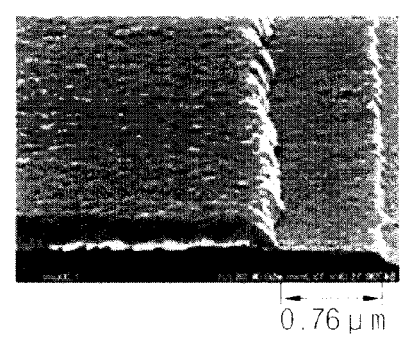
Figure 14D:
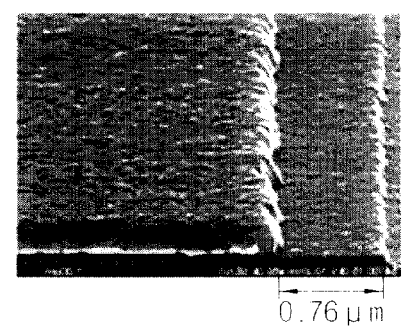

FIG. 14A is a SEM picture before removing the IZO layer, and the distance between the end portion of the titanium pattern and the end portion of the metal pattern is about 0.77 µm. FIG. 14B is a SEM picture after removing the IZO layer using the etchant for about 5 minutes, and the distance between the end portion of the titanium pattern and the end portion of the metal pattern is about 0.76 µm. FIG. 14C is a SEM picture after removing the IZO layer using the etchant for about 10 minutes, and the distance between the end portion of the titanium pattern and the end portion of the metal pattern is about 0.76 µm. FIG. 14D is a SEM picture after removing the IZO layer using the etchant for about 15 minutes, and the distance between the end portion of the titanium pattern and the end portion of the metal pattern is about 0.76 µm. Referring to FIG. 14A to FIG. 14D, each of the distances is not substantially changed and a thickness of the metal pattern is barely changed.

FIG. 15A, FIG. 15B, FIG. 15C and FIG. 15D are SEM pictures illustrating a surface condition of the copper layer according to a time for which the copper layer contacts with the etchant according to Comparative Example 1.

Figure 15A:
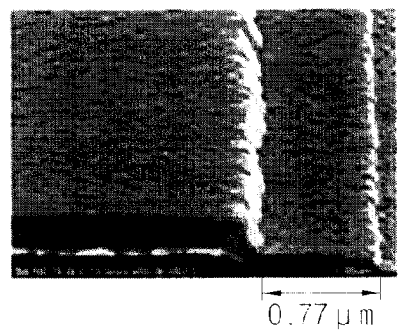
FIG. 15A, FIG. 15B, FIG. 15C, and FIG. 15D are SEM pictures illustrating a surface condition of the copper layer according to a time for which the copper layer contacts with the etchant according to Comparative Example 1.
Figure 15B:
Figure 15C:
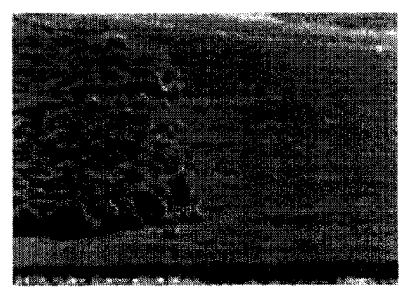
Figure 15D:

FIG. 15A is a SEM picture before removing the IZO layer, and the distance between the end portion of the titanium pattern and the end portion of the metal pattern is about 0.77 µm. FIG. 15B is a SEM picture after removing the IZO layer using the etchant for about 5 minutes, the metal pattern is greatly corroded so that the distance between the end portion of the titanium pattern and the end portion of the metal pattern is not measured. FIG. 15C is a SEM picture after removing the IZO layer using the etchant for about 10 minutes, and FIG. 15D is a SEM picture after removing the IZO layer using the etchant for about 15 minutes. In FIG. 15C and FIG. 15D, the metal pattern is too greatly corroded to measure the distance between the end portion of the titanium pattern and the end portion of the metal pattern. In addition, referring to FIG. 15B, FIG. 15C and FIG. 15D, a thickness of each of the metal patterns is greatly decreased.

Figure 16A:
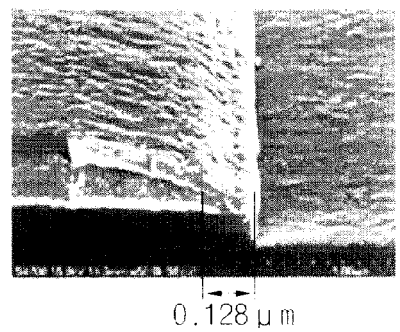
FIG. 16A, FIG. 16B, FIG. 16C, and FIG. 16D are SEM pictures illustrating a surface condition of the copper layer according to a time for which the copper layer contacts with the etchant according to Comparative Example 2.
Figure 16B:
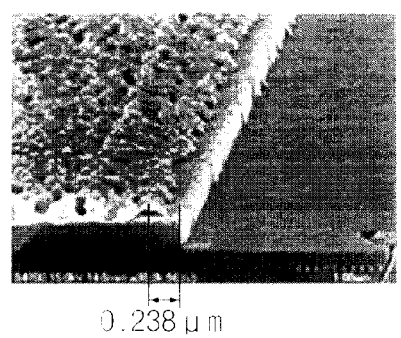
Figure 16C:
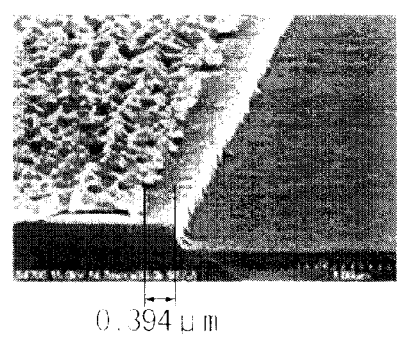
Figure 16D:
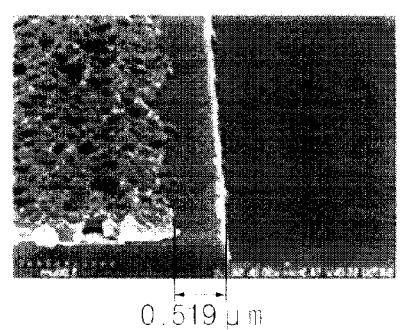

FIG. 16A, FIG. 16B, FIG. 16C and FIG. 16D are SEM pictures illustrating a surface condition of the copper layer according to a time for which the copper layer contacts with the etchant according to Comparative Example 2. FIG. 16A is a SEM picture before removing the IZO layer, and the distance between the end portion of the titanium pattern and the end portion of the metal pattern is about 0.128 µm. FIG. 16B is a SEM picture after removing the IZO layer using the etchant for about 5 minutes, and the distance between the end portion of the titanium pattern and the end portion of the metal pattern is about 0.238 µm. FIG. 16C is a SEM picture after removing the IZO layer using the etchant for about 10 minutes, and the distance is between the end portion of the titanium pattern and the end portion of the metal pattern is about 0.394 µm. FIG. 14D is a SEM picture after removing the IZO layer using the etchant for about 15 minutes, and the distance between the end portion of the titanium pattern and the end portion of the metal pattern is about 0.519 µm. Referring to FIG. 16A to 16D, the distance is increased, and a thickness of the metal pattern is decreased as the etching time is increased.

According to the above descriptions, the etchant according to the present invention has an etching characteristic of the IZO layer and does almost no damage the metal pattern including copper.

According to the present invention, when a copper layer is formed under an indium oxide layer, the non-halogenated etchant of the indium oxide layer may not damage the copper layer and selectively etch the indium oxide layer. Although a lower layer formed under the indium oxide layer includes an aluminum layer, the non-halogenated etchant may not damage the aluminum layer in etching the indium oxide layer. Thus, the non-halogenated etchant may minimize damage to the lower layer for both the copper layer and the aluminum layer. Further, the non-halogenated etchant of the indium oxide layer may prevent photosensitive materials of a photoresist pattern used as an etching stop layer of the indium oxide layer from being damaged, and residues of the indium oxide layer may be minimized.

Furthermore, a crystallization of oxalic acid of an oxalic based etchant in a temperature of less than about 0° C. or a damage of the lower layer by an aqua regia based etchant may be fundamentally prevented by using the non-halogenated etchant of the indium oxide layer.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:
1. A non-halogenated etchant for etching an indium oxide layer, comprising:
   nitric acid;
   sulfuric acid;
   a corrosion inhibitor comprising ammonium;
   a cyclic amine-based compound; and
   water,
   wherein, based on a total weight of the non-halogenated etchant:
   an amount of nitric acid is between about 1% and about 10% by weight;
   an amount of sulfuric acid is between about 1% and about 10% by weight;
   an amount of the corrosion inhibitor is between about 0.1% and about 5% by weight;

an amount of the cyclic amine-based compound is between about 0.1% and about 5% by weight; and
a remainder of water.

2. The non-halogenated etchant of claim 1, wherein the corrosion inhibitor comprises at least one selected from the group consisting of ammonium acetate ($CH_3COONH_4$), ammonium sulfamate ($NH_4SO_3NH_2$), ammonium benzenediol ($NH_4C_6H_4(OH)_2$), ammonium carbamate ($NH_2COONH_4$), ammonium dihydrogen phosphate ($NH_4H_2PO_4$), ammonium formate ($NH_4COOH$), ammonium bicarbonate ($NH_4HCO_3$), ammonium citrate ($H_4NO_2CCH_2C(OH)(CO_2NH_4)CH_2CO_2NH_4$)), ammonium nitrate ($NH_4NO_3$), ammonium persulfate (($NH_4)_2S_2O_8$), ammonium sulphamate ($H_2NSO_3NH_4$), and ammonium sulfate (($NH_4)_2SO_4$).

3. The non-halogenated etchant of claim 1, wherein the cyclic amine-based compound comprises a water-soluble heterocyclic amine compound.

4. The non-halogenated etchant of claim 3, wherein the cyclic amine-based compound comprises at least one selected from the group consisting of aminotetrazole, imidazole, indole, purine, pyrazole, pyridine, pyrimidine, pyrrole, pyrrolidine, and pyrroline.

5. A method of manufacturing a display substrate, the method comprising:
    forming a switching element on a substrate, the switching element comprising a gate electrode, a source electrode, and a drain electrode;
    forming an indium oxide layer on the substrate;
    forming a photoresist pattern on the indium oxide layer; and
    etching portions of the indium oxide layer uncovered by the photoresist pattern with a non-halogenated etchant to form a pixel electrode electrically connected to the drain electrode, the non-halogenated etchant comprising nitric acid, sulfuric acid, a corrosion inhibitor including ammonium, a cyclic amine-based compound, and water, wherein:
    an amount of nitric acid is between about 1% and about 10% by weight;
    an amount of sulfuric acid is between about 1% and about 10% by weight;
    an amount of the corrosion inhibitor is between about 0.1% and about 5% by weight;
    an amount of the cyclic amine-based compound is between about 0.1% and about 5% by weight; and
    a remainder of water, based on a total weight of the non-halogenated.

6. The method of claim 5, wherein the corrosion inhibitor comprises at least one selected from the group consisting of ammonium acetate ($CH_3COONH_4$), ammonium sulfamate ($NH_4SO_3NH_2$), ammonium benzenediol ($NH_4C_6H_4(OH)_2$), ammonium carbamate ($NH_2COONH_4$), ammonium dihydrogen phosphate ($NH_4H_2PO_4$), ammonium formate ($NH_4COOH$), ammonium bicarbonate ($NH_4HCO_3$), ammonium citrate ($H_4NO_2CCH_2C(OH)(CO_2NH_4)CH_2CO_2NH_4$)), ammonium nitrate ($NH_4NO_3$), ammonium persulfate (($NH_4)_2S_2O_8$), ammonium sulphamate ($H_2NSO_3NH_4$) and ammonium sulfate (($NH_4)_2SO_4$).

7. The method of claim 5, wherein the cyclic amine-based compound comprises at least one selected from the group consisting of aminotetrazole, imidazole, indole, purine, pyrazole, pyridine, pyrimidine, pyrrole, pyrrolidine, and pyrroline.

8. The method of claim 5, wherein each of the source electrode and the drain electrode comprises a copper layer.

9. The method of claim 5, wherein the first pixel electrode is formed by:
    forming the indium oxide layer on the substrate to cover the substrate on which the switching element is formed; and
    etching the indium oxide layer using the non-halogenated etchant,
    wherein the first pixel electrode directly contacts the drain electrode.

10. The method of claim 5, further comprising:
    forming an insulating layer on the substrate on which the first pixel electrode is formed; and
    forming a second pixel electrode overlapping with the first pixel electrode, the second pixel electrode comprising a slit pattern.

11. The method of claim 10, further comprising etching the insulating layer to form a pad hole on an end portion of a signal line connected to the switching element.

12. The method of claim 11, wherein forming the second pixel electrode comprises:
    forming a contact electrode contacting the end portion of the signal line through the pad hole.

13. The method of claim 11, wherein forming the first pixel electrode comprises:
    forming a buffer electrode on the end portion of the signal line connected to the switching element.

14. The method of claim 13, wherein forming the second pixel electrode comprises:
    forming a contact electrode contacting the end portion of the signal line through the pad hole.

15. The method of claim 5, further comprising:
    forming an insulating layer on the substrate to cover the substrate on which the switching element is formed; and
    patterning the insulating layer to form a contact hole partially exposing the drain electrode.

16. The method of claim 15, wherein the first pixel electrode is formed by:
    forming the indium oxide layer on the substrate to cover the substrate on which the contact hole is formed; and
    etching the indium oxide layer,
    wherein the first pixel electrode contacts the drain electrode through the contact hole.

17. The method of claim 5, wherein the indium oxide layer is amorphous, and
    wherein patterning the indium oxide layer further comprises thermally heating the first pixel electrode to crystallize the first pixel electrode.

18. A method of manufacturing a display substrate, the method comprising:
    forming a switching element on a substrate, the switching element comprising a gate electrode, a source electrode and a drain electrode;
    forming a first pixel electrode directly contacting the drain electrode, the first pixel electrode comprising an indium oxide layer;
    removing the first pixel electrode using a non-halogenated etchant comprising nitric acid, sulfuric acid, a corrosion inhibitor comprising ammonium, a cyclic amine-based compound, and water; and
    forming a second pixel electrode on the substrate after removing the first pixel electrode, the second pixel electrode directly contacting the drain electrode.

19. The method of claim 18, wherein an amount of nitric acid is between about 1% and about 10% by weight, an amount of sulfuric acid is between about 1% and about 10% by weight, an amount of the corrosion inhibitor is between about 0.1% and about 5% by weight, an amount of the cyclic amine-based compound is between about 0.1% and about 5% by weight, and a remainder of water, based on a total weight of the non-halogenated etchant.

20. The method of claim 18, wherein the source electrode and the drain electrode each comprise a copper layer.

21. The method of claim 18, further comprising:
forming an insulating layer on the substrate on which the switching element is formed, the insulating layer comprising a contact hole partially exposing the drain electrode,
wherein each of the first pixel electrode and the second pixel electrode contact the drain electrode through the contact hole.

22. The method of claim 18, wherein forming the first pixel electrode comprises:
forming the indium oxide layer on the substrate to cover the substrate on which the switching element is formed; and
patterning the indium oxide layer.

23. A method of manufacturing a display substrate, the method comprising:
forming a conductor on a substrate;
forming an indium oxide layer on the substrate and on an upper surface of the conductor; and
patterning the indium oxide layer using a non-halogenated etchant, the non-halogenated etchant comprising nitric acid, sulfuric acid, a corrosion inhibitor including ammonium, a cyclic amine-based compound, and water,
wherein the indium oxide layer is electrically connected to the conductor.

* * * * *